(12) United States Patent
Laufer et al.

(10) Patent No.: US 11,863,269 B2
(45) Date of Patent: Jan. 2, 2024

(54) HIGH-ORDER DIGITAL POST-DISTORTION

(71) Applicant: QUALCOMM Incorporated, San Diego, CA (US)

(72) Inventors: Yaron Laufer, Givat Shmuel (IL); Gideon Shlomo Kutz, Ramat Hasharon (IL); Shay Landis, Hod Hasharon (IL); Yaniv Eistein, Tel Aviv (IL); Ronen Shaked, Kfar Saba (IL); Assaf Touboul, Netanya (IL)

(73) Assignee: QUALCOMM Incorporated, San Diego, CA (US)

( * ) Notice: Subject to any disclaimer, the term of this patent is extended or adjusted under 35 U.S.C. 154(b) by 186 days.

(21) Appl. No.: 17/338,881

(22) Filed: Jun. 4, 2021

(65) Prior Publication Data

US 2022/0393734 A1 Dec. 8, 2022

(51) Int. Cl.
*H04B 7/06* (2006.01)
*H04B 17/13* (2015.01)
*H04B 17/391* (2015.01)
*H04B 17/382* (2015.01)

(52) U.S. Cl.
CPC .......... *H04B 7/0626* (2013.01); *H04B 17/13* (2015.01); *H04B 17/382* (2015.01); *H04B 17/391* (2015.01)

(58) Field of Classification Search
CPC .... H04B 7/0626; H04B 17/13; H04B 17/382; H04B 17/391
See application file for complete search history.

(56) References Cited

U.S. PATENT DOCUMENTS

| | | | |
|---|---|---|---|
| 2005/0099230 A1* | 5/2005 | Shanbhag | H03F 1/3247 330/149 |
| 2015/0049843 A1* | 2/2015 | Reuven | H04B 1/0475 375/296 |
| 2018/0159483 A1* | 6/2018 | Masood | H03F 3/217 |
| 2019/0356346 A1* | 11/2019 | Kawasaki | H04B 1/0475 |
| 2023/0130805 A1* | 4/2023 | Abotabl | H03F 3/245 375/262 |

* cited by examiner

*Primary Examiner* — Freshteh N Aghdam
(74) *Attorney, Agent, or Firm* — Harrity & Harrity, LLP

(57) ABSTRACT

Various aspects of the present disclosure generally relate to wireless communication. In some aspects, a user equipment (UE) may receive, from a base station, an indication of a change in a non-linearity model associated with a power amplifier of the base station. The UE may update a model associated with the power amplifier based at least in part on the indication. The UE may further update at least one parameter associated with slicing received signals based at least in part on the indication. In some aspects, the UE may use at least two coefficients when slicing. Numerous other aspects are described.

28 Claims, 9 Drawing Sheets

HIGH-ORDER DIGITAL POST-DISTORTION

FIELD OF THE DISCLOSURE

Aspects of the present disclosure generally relate to wireless communication and to techniques and apparatuses for performing high-order digital post-distortion.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power, or the like). Examples of such multiple-access technologies include code division multiple access (CDMA) systems, time division multiple access (TDMA) systems, frequency-division multiple access (FDMA) systems, orthogonal frequency-division multiple access (OFDMA) systems, single-carrier frequency-division multiple access (SC-FDMA) systems, time division synchronous code division multiple access (TD-SCDMA) systems, and Long Term Evolution (LTE). LTE/LTE-Advanced is a set of enhancements to the Universal Mobile Telecommunications System (UMTS) mobile standard promulgated by the Third Generation Partnership Project (3GPP).

A wireless network may include a number of base stations (BSs) that can support communication for a number of user equipment (UEs). A UE may communicate with a BS via the downlink and uplink. "Downlink" (or forward link) refers to the communication link from the BS to the UE, and "uplink" (or reverse link) refers to the communication link from the UE to the BS. As will be described in more detail herein, a BS may be referred to as a Node B, a gNB, an access point (AP), a radio head, a transmit receive point (TRP), a New Radio (NR) BS, a 5G Node B, or the like.

The above multiple access technologies have been adopted in various telecommunication standards to provide a common protocol that enables different user equipment to communicate on a municipal, national, regional, and even global level. NR, which may also be referred to as 5G, is a set of enhancements to the LTE mobile standard promulgated by the 3GPP. NR is designed to better support mobile broadband Internet access by improving spectral efficiency, lowering costs, improving services, making use of new spectrum, and better integrating with other open standards using orthogonal frequency division multiplexing (OFDM) with a cyclic prefix (CP) (CP-OFDM) on the downlink (DL), using CP-OFDM and/or SC-FDM (e.g., also known as discrete Fourier transform spread OFDM (DFT-s-OFDM)) on the uplink (UL), as well as supporting beamforming, multiple-input multiple-output (MIMO) antenna technology, and carrier aggregation. As the demand for mobile broadband access continues to increase, further improvements in LTE, NR, and other radio access technologies remain useful.

SUMMARY

In some aspects, a user equipment (UE) for wireless communication includes a memory and one or more processors coupled to the memory, the memory and the one or more processors configured to receive, from a base station, an indication of a change in a non-linearity model associated with a power amplifier of the base station; update a model associated with the power amplifier based at least in part on the indication; and update at least one parameter associated with slicing received signals based at least in part on the indication.

In some aspects, a base station for wireless communication includes a memory and one or more processors coupled to the memory, the memory and the one or more processors configured to determine a change in a non-linearity model associated with a power amplifier of the base station; and transmit, to a UE, an indication of the change.

In some aspects, a UE for wireless communication includes a memory and one or more processors coupled to the memory, the memory and the one or more processors configured to receive, from a base station, a signal that was amplified using a power amplifier that is at least partially non-linear; estimate a portion of the received signal that includes an original data signal using slicing with at least two coefficients; estimate a portion of the signal that includes a distortion using a model associated with the power amplifier; and generate a reconstructed signal based at least in part on the received signal, the estimated portion including the original data signal, and the estimated portion including the distortion.

In some aspects, a method of wireless communication performed by a UE includes receiving, from a base station, an indication of a change in a non-linearity model associated with a power amplifier of the base station; updating a model associated with the power amplifier based at least in part on the indication; and updating at least one parameter associated with slicing received signals based at least in part on the indication.

In some aspects, a method of wireless communication performed by a base station includes determining a change in a non-linearity model associated with a power amplifier of the base station; and transmitting, to a UE, an indication of the change.

In some aspects, a method of wireless communication performed by a UE includes receiving, from a base station, a signal that was amplified using a power amplifier that is at least partially non-linear; estimating a portion of the received signal that includes an original data signal using slicing with at least two coefficients; estimating a portion of the signal that includes a distortion using a model associated with the power amplifier; and generating a reconstructed signal based at least in part on the received signal, the estimated portion including the original data signal, and the estimated portion including the distortion.

In some aspects, a non-transitory computer-readable medium storing a set of instructions for wireless communication includes one or more instructions that, when executed by one or more processors of a UE, cause the UE to receive, from a base station, an indication of a change in a non-linearity model associated with a power amplifier of the base station; update a model associated with the power amplifier based at least in part on the indication; and update at least one parameter associated with slicing received signals based at least in part on the indication.

In some aspects, a non-transitory computer-readable medium storing a set of instructions for wireless communication includes one or more instructions that, when executed by one or more processors of a base station, cause the base station to determine a change in a non-linearity model associated with a power amplifier of the base station; and transmit, to a UE, an indication of the change.

In some aspects, a non-transitory computer-readable medium storing a set of instructions for wireless communication includes one or more instructions that, when executed by one or more processors of a UE, cause the UE to receive, from a base station, a signal that was amplified using a power amplifier that is at least partially non-linear; estimate a portion of the received signal that includes an original data signal using slicing with at least two coefficients; estimate a portion of the signal that includes a distortion using a model associated with the power amplifier; and generate a reconstructed signal based at least in part on the received signal, the estimated portion including the original data signal, and the estimated portion including the distortion.

In some aspects, an apparatus for wireless communication includes means for receiving, from a base station, an indication of a change in a non-linearity model associated with a power amplifier of the base station; means for updating a model associated with the power amplifier based at least in part on the indication; and means for updating at least one parameter associated with slicing received signals based at least in part on the indication.

In some aspects, an apparatus for wireless communication includes means for determining a change in a non-linearity model associated with a power amplifier of the apparatus; and means for transmitting, to a UE, an indication of the change.

In some aspects, an apparatus for wireless communication includes means for receiving, from a base station, a signal that was amplified using a power amplifier that is at least partially non-linear; means for estimating a portion of the received signal that includes an original data signal using slicing with at least two coefficients; means for estimating a portion of the signal that includes a distortion using a model associated with the power amplifier; and means for generating a reconstructed signal based at least in part on the received signal, the estimated portion including the original data signal, and the estimated portion including the distortion.

Aspects generally include a method, apparatus, system, computer program product, non-transitory computer-readable medium, user equipment, base station, wireless communication device, and/or processing system as substantially described herein with reference to and as illustrated by the drawings and specification.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects are described in the present disclosure by illustration to some examples, those skilled in the art will understand that such aspects may be implemented in many different arrangements and scenarios. Techniques described herein may be implemented using different platform types, devices, systems, shapes, sizes, and/or packaging arrangements. For example, some aspects may be implemented via integrated chip embodiments or other non-module-component based devices (e.g., end-user devices, vehicles, communication devices, computing devices, industrial equipment, retail/purchasing devices, medical devices, or artificial intelligence-enabled devices). Aspects may be implemented in chip-level components, modular components, non-modular components, non-chip-level components, device-level components, or system-level components. Devices incorporating described aspects and features may include additional components and features for implementation and practice of claimed and described aspects. For example, transmission and reception of wireless signals may include a number of components for analog and digital purposes (e.g., hardware components including antennas, radio frequency (RF) chains, power amplifiers, modulators, buffers, processors, interleavers, adders, or summers). It is intended that aspects described herein may be practiced in a wide variety of devices, components, systems, distributed arrangements, or end-user devices of varying size, shape, and constitution.

BRIEF DESCRIPTION OF THE DRAWINGS

So that the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects. The same reference numbers in different drawings may identify the same or similar elements.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

Several aspects of telecommunication systems will now be presented with reference to various apparatuses and techniques. These apparatuses and techniques will be described in the following detailed description and illustrated in the accompanying drawings by various blocks, modules, components, circuits, steps, processes, algorithms, or the like (collectively referred to as "elements"). These elements may be implemented using hardware, software, or combinations thereof. Whether such elements are implemented as hardware or software depends upon the particular application and design constraints imposed on the overall system.

It should be noted that while aspects may be described herein using terminology commonly associated with a 5G or NR radio access technology (RAT), aspects of the present disclosure can be applied to other RATs, such as a 3G RAT, a 4G RAT, and/or a RAT subsequent to 5G (e.g., 6G).

Figure 1:
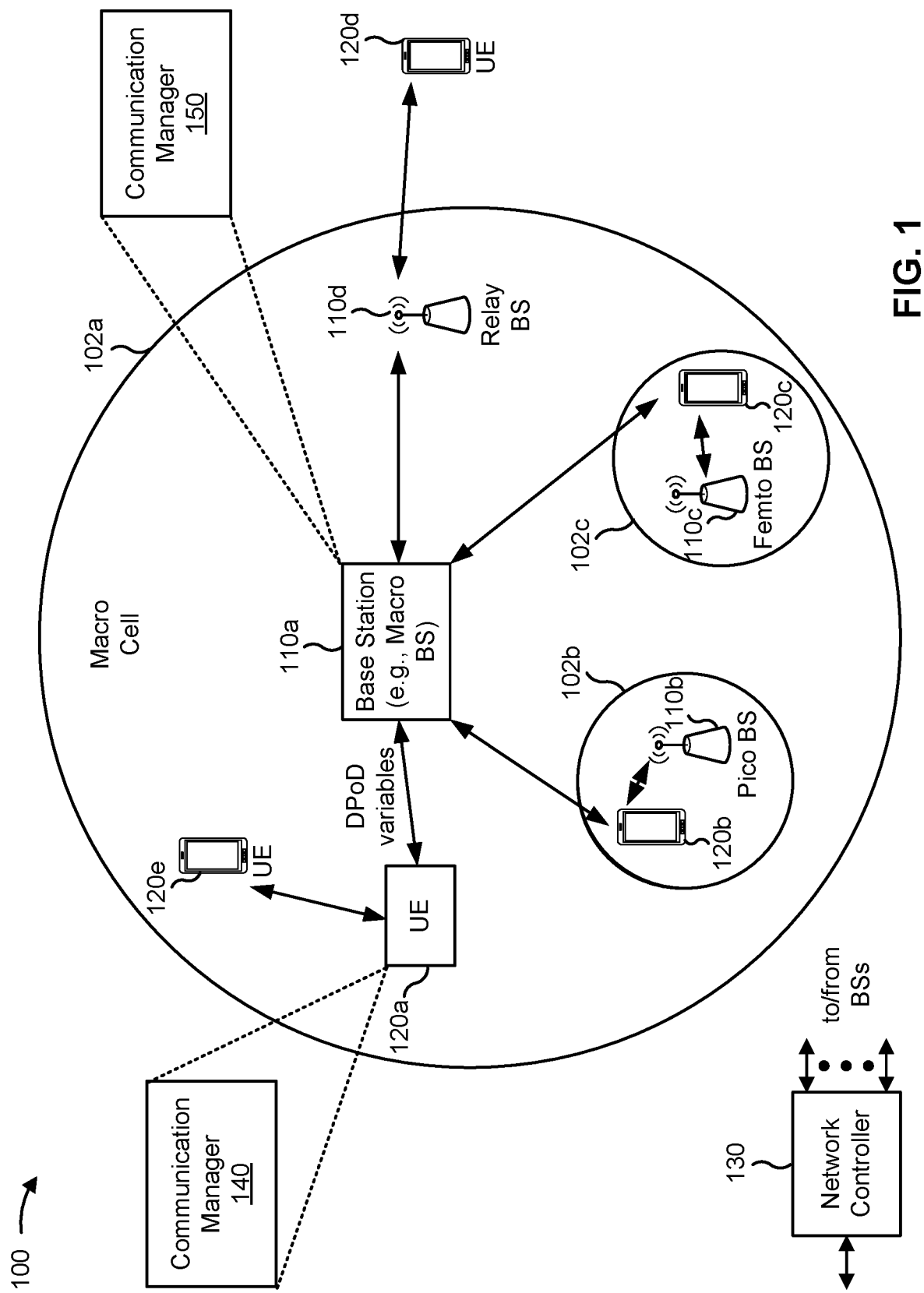
FIG. 1 is a diagram illustrating an example of a wireless network, in accordance with the present disclosure.

FIG. 1 is a diagram illustrating an example of a wireless network 100, in accordance with the present disclosure. The wireless network 100 may be or may include elements of a 5G (NR) network and/or an LTE network, among other examples. The wireless network 100 may include a number of base stations 110 (shown as BS 110a, BS 110b, BS 110c, and BS 110d) and other network entities. A base station (BS) is an entity that communicates with user equipment (UEs) and may also be referred to as an NR BS, a Node B, a gNB, a 5G node B (NB), an access point, a transmit receive point (TRP), or the like. Each BS may provide communication coverage for a particular geographic area. In 3GPP, the term "cell" can refer to a coverage area of a BS and/or a BS subsystem serving this coverage area, depending on the context in which the term is used.

A BS may provide communication coverage for a macro cell, a pico cell, a femto cell, and/or another type of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a closed subscriber group (CSG)). ABS for a macro cell may be referred to as a macro BS. ABS for a pico cell may be referred to as a pico BS. A BS for a femto cell may be referred to as a femto BS or a home BS. In the example shown in FIG. 1, a BS 110a may be a macro BS for a macro cell 102a, a BS 110b may be a pico BS for a pico cell 102b, and a BS 110c may be a femto BS for a femto cell 102c. A BS may support one or multiple (e.g., three) cells. The terms "eNB", "base station", "NR BS", "gNB", "TRP", "AP", "node B", "5G NB", and "cell" may be used interchangeably herein.

In some aspects, a cell may not necessarily be stationary, and the geographic area of the cell may move according to the location of a mobile BS. In some aspects, the BSs may be interconnected to one another and/or to one or more other BSs or network nodes (not shown) in the wireless network 100 through various types of backhaul interfaces, such as a direct physical connection or a virtual network, using any suitable transport network.

Wireless network 100 may also include relay stations. A relay station is an entity that can receive a transmission of data from an upstream station (e.g., a BS or a UE) and send a transmission of the data to a downstream station (e.g., a UE or a BS). A relay station may also be a UE that can relay transmissions for other UEs. In the example shown in FIG. 1, a relay BS 110d may communicate with macro BS 110a and a UE 120d in order to facilitate communication between BS 110a and UE 120d. A relay BS may also be referred to as a relay station, a relay base station, a relay, or the like.

Wireless network 100 may be a heterogeneous network that includes BSs of different types, such as macro BSs, pico BSs, femto BSs, relay BSs, or the like. These different types of BSs may have different transmit power levels, different coverage areas, and different impacts on interference in wireless network 100. For example, macro BSs may have a high transmit power level (e.g., 5 to 40 watts) whereas pico BSs, femto BSs, and relay BSs may have lower transmit power levels (e.g., 0.1 to 2 watts).

A network controller 130 may couple to a set of BSs and may provide coordination and control for these BSs. Network controller 130 may communicate with the BSs via a backhaul. The BSs may also communicate with one another, e.g., directly or indirectly via a wireless or wireline backhaul.

UEs 120 (e.g., 120a, 120b, 120c) may be dispersed throughout wireless network 100, and each UE may be stationary or mobile. A UE may also be referred to as an access terminal, a terminal, a mobile station, a subscriber unit, a station, or the like. A UE may be a cellular phone (e.g., a smart phone), a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or equipment, biometric sensors/devices, wearable devices (smart watches, smart clothing, smart glasses, smart wrist bands, smart jewelry (e.g., smart ring, smart bracelet)), an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium.

Some UEs may be considered machine-type communication (MTC) or evolved or enhanced machine-type communication (eMTC) UEs. MTC and eMTC UEs include, for example, robots, drones, remote devices, sensors, meters, monitors, and/or location tags, that may communicate with a base station, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices, and/or may be implemented as NB-IoT (narrowband internet of things) devices. Some UEs may be considered a Customer Premises Equipment (CPE). UE 120 may be included inside a housing that houses components of UE 120, such as processor components and/or memory components. In some aspects, the processor components and the memory components may be coupled together. For example, the processor components (e.g., one or more processors) and the memory components (e.g., a memory) may be operatively coupled, communicatively coupled, electronically coupled, and/or electrically coupled.

In general, any number of wireless networks may be deployed in a given geographic area. Each wireless network may support a particular RAT and may operate on one or more frequencies. A RAT may also be referred to as a radio technology, an air interface, or the like. A frequency may also be referred to as a carrier, a frequency channel, or the like. Each frequency may support a single RAT in a given geographic area in order to avoid interference between wireless networks of different RATs. In some cases, NR or 5G RAT networks may be deployed.

In some aspects, two or more UEs 120 (e.g., shown as UE 120a and UE 120e) may communicate directly using one or more sidelink channels (e.g., without using a base station 110 as an intermediary to communicate with one another). For example, the UEs 120 may communicate using peer-to-peer (P2P) communications, device-to-device (D2D) communications, a vehicle-to-everything (V2X) protocol (e.g., which may include a vehicle-to-vehicle (V2V) protocol or a vehicle-to-infrastructure (V2I) protocol), and/or a mesh network. In this case, the UE 120 may perform scheduling operations, resource selection operations, and/or other operations described elsewhere herein as being performed by the base station 110.

Devices of wireless network 100 may communicate using the electromagnetic spectrum, which may be subdivided based on frequency or wavelength into various classes, bands, channels, or the like. For example, devices of wireless network 100 may communicate using an operating band having a first frequency range (FR1), which may span from 410 MHz to 7.125 GHz, and/or may communicate using an operating band having a second frequency range (FR2), which may span from 24.25 GHz to 52.6 GHz. The frequencies between FR1 and FR2 are sometimes referred to as mid-band frequencies. Although a portion of FR1 is greater than 6 GHz, FR1 is often referred to as a "sub-6 GHz" band. Similarly, FR2 is often referred to as a "millimeter wave" band despite being different from the extremely high frequency (EHF) band (30 GHz-300 GHz) which is identified by the International Telecommunications Union (ITU) as a "millimeter wave" band. Thus, unless specifically stated otherwise, it should be understood that the term "sub-6 GHz" or the like, if used herein, may broadly represent frequencies less than 6 GHz, frequencies within FR1, and/or mid-band frequencies (e.g., greater than 7.125 GHz). Similarly, unless specifically stated otherwise, it should be understood that the term "millimeter wave" or the like, if used herein, may broadly represent frequencies within the EHF band, frequencies within FR2, and/or mid-band frequencies (e.g., less than 24.25 GHz). It is contemplated that the frequencies included in FR1 and FR2 may be modified, and techniques described herein are applicable to those modified frequency ranges.

In some aspects, the UE 120 may include a communication manager 140. As described in more detail elsewhere herein, the communication manager 140 may receive (e.g., from the base station 110) an indication of a change in a non-linearity model associated with a power amplifier of the base station 110, update a model associated with the power amplifier based at least in part on the indication, and update at least one parameter associated with slicing received signals based at least in part on the indication. Accordingly, as shown in FIG. 1, the UE 120 may perform digital post-distortion (also referred to as "DPoD") on signals received from the base station 110. For example, as described in more detail elsewhere herein, the communication manager 140 may receive (e.g., from the base station 110) a signal that was amplified using a power amplifier that is at least partially non-linear, estimate a portion of the received signal that includes an original data signal using slicing with at least two coefficients, estimate a portion of the signal that includes a distortion using a model associated with the power amplifier, and generate a reconstructed signal based at least in part on the received signal, the estimated portion including the original data signal, and the estimated portion including the distortion. Additionally, or alternatively, the communication manager 140 may perform one or more other operations described herein.

In some aspects, the base station 110 may include a communication manager 150. As described in more detail elsewhere herein, the communication manager 150 may determine a change in a non-linearity model associated with a power amplifier of the base station 110; and transmit (e.g., to the UE 120) an indication of the change. Additionally, or alternatively, the communication manager 150 may perform one or more other operations described herein.

As indicated above, FIG. 1 is provided as an example. Other examples may differ from what is described with regard to FIG. 1.

Figure 2:
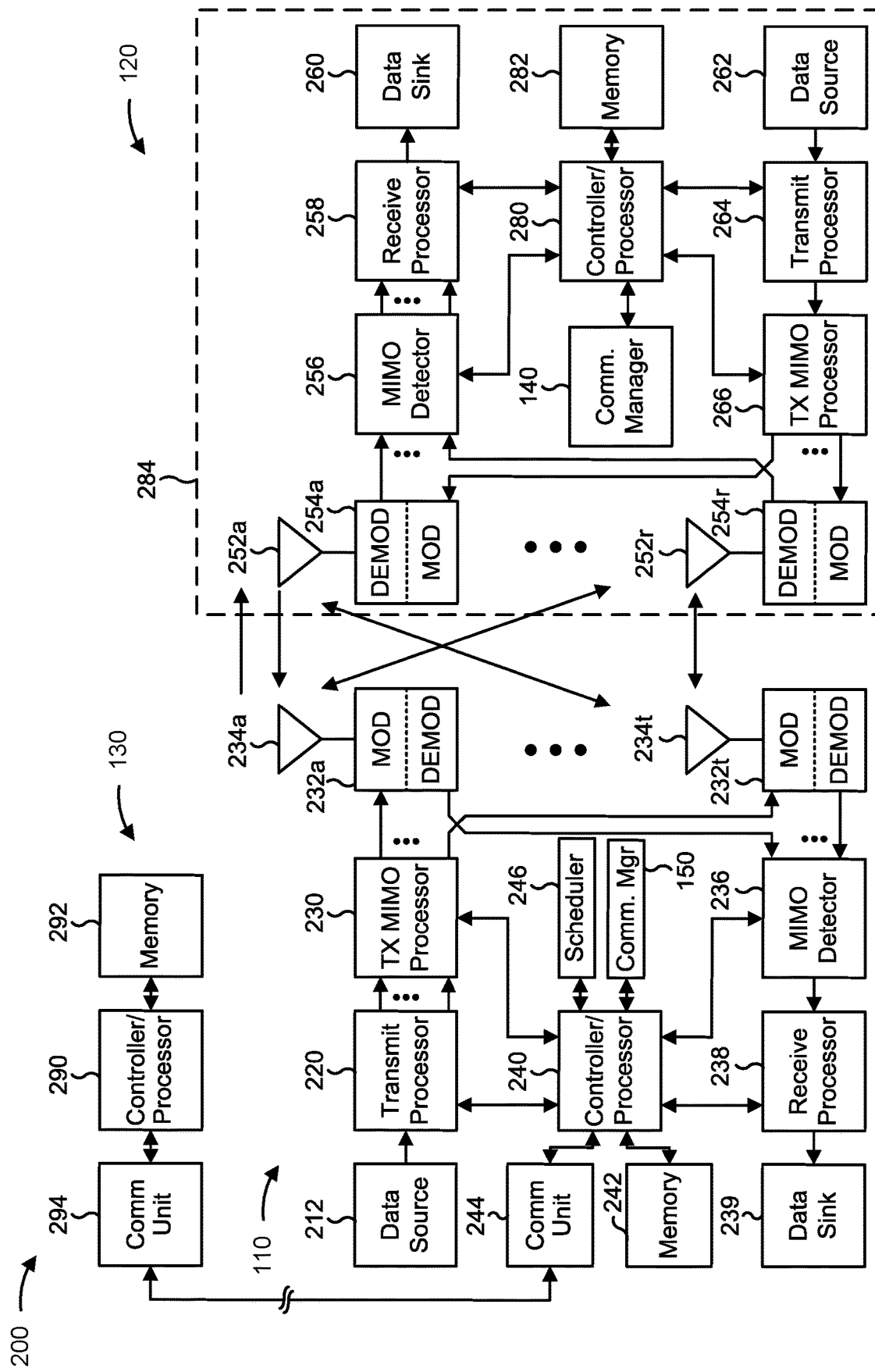
FIG. 2 is a diagram illustrating an example of a base station in communication with a UE in a wireless network, in accordance with the present disclosure.

FIG. 2 is a diagram illustrating an example 200 of a base station 110 in communication with a UE 120 in a wireless network 100, in accordance with the present disclosure. Base station 110 may be equipped with T antennas 234a through 234t, and UE 120 may be equipped with R antennas 252a through 252r, where in general T≥1 and R≥1.

At base station 110, a transmit processor 220 may receive data from a data source 212 for one or more UEs, select one or more modulation and coding schemes (MCS) for each UE based at least in part on channel quality indicators (CQIs) received from the UE, process (e.g., encode and modulate) the data for each UE based at least in part on the MCS(s) selected for the UE, and provide data symbols for all UEs. Transmit processor 220 may also process system information (e.g., for semi-static resource partitioning information (SRPI)) and control information (e.g., CQI requests, grants, and/or upper layer signaling) and provide overhead symbols and control symbols. Transmit processor 220 may also generate reference symbols for reference signals (e.g., a cell-specific reference signal (CRS) or a demodulation reference signal (DMRS)) and synchronization signals (e.g., a primary synchronization signal (PSS) or a secondary synchronization signal (SSS)). A transmit (TX) multiple-input multiple-output (MIMO) processor 230 may perform spatial processing (e.g., precoding) on the data symbols, the control symbols, the overhead symbols, and/or the reference symbols, if applicable, and may provide T output symbol streams to T modulators (MODs) 232a through 232t. Each modulator 232 may process a respective output symbol stream (e.g., for OFDM) to obtain an output sample stream. Each modulator 232 may further process (e.g., convert to analog, amplify, filter, and upconvert) the output sample stream to obtain a downlink signal. T downlink signals from modulators 232a through 232t may be transmitted via T antennas 234a through 234t, respectively.

At UE 120, antennas 252a through 252r may receive the downlink signals from base station 110 and/or other base stations and may provide received signals to demodulators (DEMODs) 254a through 254r, respectively. Each demodulator 254 may condition (e.g., filter, amplify, downconvert, and digitize) a received signal to obtain input samples. Each demodulator 254 may further process the input samples (e.g., for OFDM) to obtain received symbols. A MIMO detector 256 may obtain received symbols from all R demodulators 254a through 254r, perform MIMO detection on the received symbols if applicable, and provide detected symbols. A receive processor 258 may process (e.g., demodulate and decode) the detected symbols, provide decoded data for UE 120 to a data sink 260, and provide decoded control information and system information to a controller/processor 280. The term "controller/processor" may refer to one or more controllers, one or more processors, or a combination thereof. A channel processor may determine a reference signal received power (RSRP) parameter, a received signal strength indicator (RSSI) parameter, a reference signal received quality (RSRQ) parameter, and/or a CQI parameter, among other examples. In some aspects, one or more components of UE 120 may be included in a housing 284.

Network controller 130 may include communication unit 294, controller/processor 290, and memory 292. Network controller 130 may include, for example, one or more devices in a core network. Network controller 130 may communicate with base station 110 via communication unit 294.

Antennas (e.g., antennas 234a through 234t and/or antennas 252a through 252r) may include, or may be included within, one or more antenna panels, antenna groups, sets of antenna elements, and/or antenna arrays, among other examples. An antenna panel, an antenna group, a set of antenna elements, and/or an antenna array may include one or more antenna elements. An antenna panel, an antenna group, a set of antenna elements, and/or an antenna array may include a set of coplanar antenna elements and/or a set of non-coplanar antenna elements. An antenna panel, an antenna group, a set of antenna elements, and/or an antenna array may include antenna elements within a single housing and/or antenna elements within multiple housings. An antenna panel, an antenna group, a set of antenna elements, and/or an antenna array may include one or more antenna elements coupled to one or more transmission and/or reception components, such as one or more components of FIG. 2.

On the uplink, at UE 120, a transmit processor 264 may receive and process data from a data source 262 and control information (e.g., for reports that include RSRP, RSSI, RSRQ, and/or CQI) from controller/processor 280. Transmit processor 264 may also generate reference symbols for one or more reference signals. The symbols from transmit processor 264 may be precoded by a TX MIMO processor 266 if applicable, further processed by modulators 254a through 254r (e.g., for DFT-s-OFDM or CP-OFDM), and transmitted to base station 110. In some aspects, a modulator and a demodulator (e.g., MOD/DEMOD 254) of the UE 120 may be included in a modem of the UE 120. In some aspects, the UE 120 includes a transceiver. The transceiver may include any combination of antenna(s) 252, modulators and/or demodulators 254, MIMO detector 256, receive processor 258, transmit processor 264, and/or TX MIMO processor 266. The transceiver may be used by a processor (e.g., controller/processor 280) and memory 282 to perform aspects of any of the methods described herein (for example, with reference to FIGS. 3-7).

At base station 110, the uplink signals from UE 120 and other UEs may be received by antennas 234, processed by demodulators 232, detected by a MIMO detector 236 if applicable, and further processed by a receive processor 238 to obtain decoded data and control information sent by UE 120. Receive processor 238 may provide the decoded data to a data sink 239 and the decoded control information to controller/processor 240. Base station 110 may include communication unit 244 and communicate to network controller 130 via communication unit 244. Base station 110 may include a scheduler 246 to schedule UEs 120 for downlink and/or uplink communications. In some aspects, a modulator and a demodulator (e.g., MOD/DEMOD 232) of the base station 110 may be included in a modem of the base station 110. In some aspects, the base station 110 includes a transceiver. The transceiver may include any combination of antenna(s) 234, modulators and/or demodulators 232, MIMO detector 236, receive processor 238, transmit processor 220, and/or TX MIMO processor 230. The transceiver may be used by a processor (e.g., controller/processor 240) and memory 242 to perform aspects of any of the methods described herein (for example, with reference to FIGS. 3-7).

Controller/processor 240 of base station 110, controller/processor 280 of UE 120, and/or any other component(s) of FIG. 2 may perform one or more techniques associated with performing high-order digital post-distortion, as described in more detail elsewhere herein. For example, controller/processor 240 of base station 110, controller/processor 280 of UE 120, and/or any other component(s) of FIG. 2 may perform or direct operations of, for example, process 500 of FIG. 5, process 600 of FIG. 6, process 700 of FIG. 7, and/or other processes as described herein. Memories 242 and 282 may store data and program codes for base station 110 and UE 120, respectively. In some aspects, memory 242 and/or memory 282 may include a non-transitory computer-readable medium storing one or more instructions (e.g., code and/or program code) for wireless communication. For example, the one or more instructions, when executed (e.g., directly, or after compiling, converting, and/or interpreting) by one or more processors of the base station 110 and/or the UE 120, may cause the one or more processors, the UE 120, and/or the base station 110 to perform or direct operations of, for example, process 500 of FIG. 5, process 600 of FIG. 6, process 700 of FIG. 7, and/or other processes as described herein. In some aspects, executing instructions may include running the instructions, converting the instructions, compiling the instructions, and/or interpreting the instructions, among other examples.

In some aspects, a UE (e.g., the UE 120) may include means for receiving, from a base station (e.g., the base station 110), an indication of a change in a non-linearity model associated with a power amplifier of the base station; means for updating a model associated with the power amplifier based at least in part on the indication; and/or means for updating at least one parameter associated with slicing received signals based at least in part on the indication. The means for the UE to perform operations described herein may include, for example, one or more of communication manager 140, antenna 252, demodulator 254, MIMO detector 256, receive processor 258, transmit processor 264, TX MIMO processor 266, modulator 254, controller/processor 280, or memory 282.

Additionally, or alternatively, the UE 120 may include means for receiving, from a base station, a signal that was amplified using a power amplifier that is at least partially non-linear; means for estimating a portion of the received signal that includes an original data signal using slicing with at least two coefficients; means for estimating a portion of the signal that includes a distortion using a model associated with the power amplifier; and/or means for generating a reconstructed signal based at least in part on the received signal, the estimated portion including the original data signal, and the estimated portion including the distortion. The means for the UE to perform operations described herein may include, for example, one or more of communication manager 140, antenna 252, demodulator 254, MIMO detector 256, receive processor 258, transmit processor 264, TX MIMO processor 266, modulator 254, controller/processor 280, or memory 282.

In some aspects, a base station (e.g., the base station 110) may include means for determining a change in a non-linearity model associated with a power amplifier of the base station; and/or means for transmitting, to a UE (e.g., the UE 120), an indication of the change. The means for the base station to perform operations described herein may include, for example, one or more of communication manager 150, transmit processor 220, TX MIMO processor 230, modulator 232, antenna 234, demodulator 232, MIMO detector 236, receive processor 238, controller/processor 240, memory 242, or scheduler 246.

While blocks in FIG. 2 are illustrated as distinct components, the functions described above with respect to the blocks may be implemented in a single hardware, software, or combination component or in various combinations of components. For example, the functions described with respect to the transmit processor 264, the receive processor 258, and/or the TX MIMO processor 266 may be performed by or under the control of controller/processor 280.

As indicated above, FIG. 2 is provided as an example. Other examples may differ from what is described with regard to FIG. 2.

When transmitting, a base station generally uses a power amplifier (PA) to increase a magnitude associated with a downlink signal before transmitting the amplified downlink signal to a UE. However, the PA introduces some non-linear components to the amplified downlink signal. Generally, the strongest non-linear components are odd-ordered kernels (e.g., represented by forms similar to $x|x|^2$, $x|x|^4$, and so on, where the downlink signal may be represented by x).

In some cases, the UE may process a received signal (that is based on the amplified downlink signal transmitted by the base station and channel conditions between the base station and the UE) by applying digital post-distortion to remove at least some of the non-linear components introduced by the PA. Accordingly, the UE may perform a slicing operation on the received signal to estimate a portion of the received signal that includes the non-linear components as well as a modelling operation that estimates a portion of the received signal that includes residual distortion. The UE may perform slicing and modelling iteratively until convergence to estimate a portion of the received signal that includes the downlink signal.

Generally, the UE uses one coefficient during the slicing operation. For example, the UE may use a first odd-ordered kernel (e.g., which may be represented by x) with a first coefficient (e.g., which may be represented by $a_1$) to perform slicing. Accordingly, remaining non-linear components introduced by the PA are included in the residual distortion (e.g., which may be represented by d). However, larger residual distortions result in less accurate digital post-distortion by the UE, which results in wasted power and processing resources when the UE is unable to decode the received signal even after digital post-distortion. Additionally, larger residual distortions may cause the UE to waste processing resources by hindering convergence of the digital post-distortion (e.g., when convergence is dynamically determined rather than statically determined).

For time-domain modulated symbols, the non-linearities introduced by the PA result in shrinkage of the constellation for modulation of the symbols. In contrast, for OFDM symbols, the constellation is mapped to the frequency domain before the base station applies inverse fast Fourier transform (IFFT) and amplification using the PA, such that the non-linearities introduced by the PA are not applied directly on the constellation. In some cases, the base station may transmit to the UE using a single-carrier waveform, which uses time-domain modulated symbols, rather than OFDM. The base station may use the single-carrier waveform in higher frequencies (e.g., included in FR4, which may include frequencies between 52.6 GHz to 71 GHz, and/or included in FR5, which may include frequencies between 95 GHz to 325 GHz, among other examples) in order to reduce phase noise and processing overhead associated with using OFDM in the higher frequencies. Additionally, or alternatively, the single-carrier waveform may have a lower peak-to-average power ratio (PAPR) as compared with OFDM, which increases quality and/or reliability of transmissions to the UE. Generally, the constellation distortion for time-domain modulated symbols results in reduced accuracy of digital post-distortion.

Some techniques and apparatuses described herein enable a UE (e.g., UE 120) to perform high-order digital post-distortion on a received signal. In some aspects, the UE 120 may use at least two coefficients during a slicing operation. For example, the UE 120 may use a first odd-ordered kernel (e.g., which may be represented by x) with a first coefficient (e.g., which may be represented by $a_1$), a second odd-ordered kernel (e.g., represented by a form similar to $x|x^2|$) with a second coefficient (e.g., which may be represented by $a_3$), and so on, to perform slicing. These high, odd-ordered kernels account for constellation shrinkage (e.g., when using time-domain modulated symbols), and therefore decrease residual distortion and increase accuracy of digital post-distortion. As a result, the UE 120 performs more accurate digital post-distortion, which conserves power and processing resources as compared with the UE 120 being unable to decode the received signal even after digital post-distortion.

To enable high-order digital post-distortion, a base station (e.g., base station 110) may transmit an indication of a change in a non-linearity model associated with a PA of the base station 110. For example, environmental changes (e.g., temperature changes and/or humidity changes), transmission property changes (e.g., frequency changes, beam changes, phase changes, and/or other physical changes associated with transmitted signals from the base station 110), power changes associated with the PA (e.g., voltage changes and/or current changes), and/or other changes detected by the base station 110 may result in the change in the non-linearity model. Accordingly, based at least in part on the indication, the UE 120 may update the model associated with the PA (e.g., used to estimate a portion of the received signal that includes residual distortion) and update at least one parameter associated with the slicing (e.g., at least one coefficient and/or at least one kernel). As a result, the UE 120 performs more accurate digital post-distortion, which conserves power and processing resources as compared with the UE 120 being unable to decode the received signal even after digital post-distortion. The UE 120 may request additional information from the base station 110 to use for updating the model and/or updating the at least one parameter, as described herein. Additionally, or alternatively, the UE 120 may determine the update for the model and/or the update for the at least one parameter, as described herein.

Figure 3:
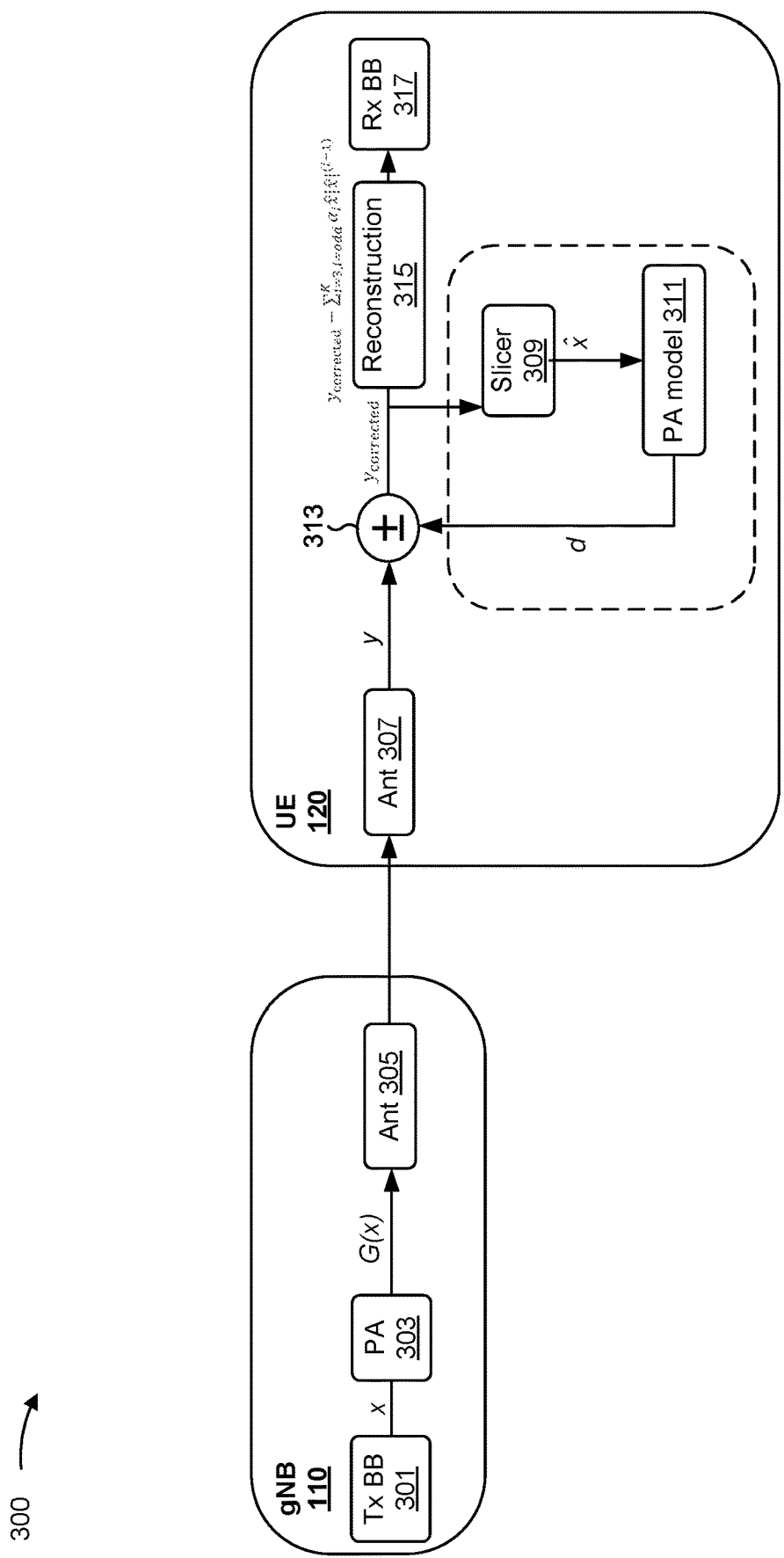
FIG. 3 is a diagram illustrating an example associated with high-order digital post-distortion (DPoD), in accordance with the present disclosure.

FIG. 3 is a diagram illustrating an example 300 associated with performing high-order digital post-distortion, in accordance with the present disclosure. As shown in FIG. 3, example 300 includes communication between a gNB 110 and a UE 120. In some aspects, the gNB 110 and the UE 120 may be included in a wireless network, such as wireless network 100.

As shown in FIG. 3, the gNB 110 may encode and modulate one or more downlink symbols for the UE 120, using a transmission broadband (Tx BB) 301, into an analog signal (e.g., represented by x in example 300). The gNB 110 may further amplify the signal using a PA 303 (e.g., with an associated amplification function that may be represented by G in example 300). The PA 303 may be at least partially non-linear. For example, imperfections in the PA 303 may introduce non-linear components to the amplified signal (e.g., represented by G(x) in example 300).

Accordingly, an antenna 305 of the gNB 110 may transmit the amplified signal to the UE 120. An antenna 307 of the UE 120 may receive an analog signal (e.g., represented by y in example 300) based at least in part on the signal transmitted by the gNB 110 and a channel from the gNB 110 to the UE 120.

The UE 120 may perform digital post-distortion to try to estimate the original data signal (e.g., represented by x in example 300). Accordingly, the UE 120 may estimate a portion of the received signal that includes the original data signal, using a slicer 309, with at least two coefficients. The estimated portion including the original data signal may be represented by 2 in example 300.

The UE 120 may use at least two coefficients (e.g., represented by $a_1$, $a_3$, and so on) to estimate the portion including the original data signal. For example, the UE 120 may use a plurality of odd powers (e.g., odd powered kernels, which may be represented by forms similar to x, $x|x|^2$, and so on) with the at least two coefficients to estimate the portion including the original data signal.

In some aspects, the digital post-distortion includes a Bussgang decomposition. For example, the UE 120 may estimate the original data signal using an expression similar to the form $$y(x)=\Sigma_{i=1,i=odd}^{K} a_i x|x|^{(i-1)}+d,$$

where y may represent the received signal, x may represent the analog data signal generated by the gNB 110, $a_i$ may represent a coefficient associated with the $i^{th}$ powered kernel, $x|x|^{(i-1)}$ may represent the $i^{th}$ powered kernel, K may determine a quantity of coefficients and odd powered kernels that are used, and d may represent residual distortion. Accordingly, the UE 120 may apply slicing with at least K=3. For example, the UE 120 may apply slicing using an expression similar to the form $$\hat{x} = \underset{x}{\operatorname{argmin}} \left| y - \sum_{k=1,i=odd}^{K} a_i x|x|^{(i-1)} \right|^2,$$

where $\hat{x}$ may represent the estimated portion including the original data signal and is based on minimization of the expression by searching over all possible constellation points associated with transmitted signal.

The coefficients may be estimated by the UE 120 and/or the gNB 110 (e.g., as described below in connection with FIG. 4). In some aspects, the kernels and the coefficients may be represented by a matrix expression similar to the form $$y = [x, x|x|^2, \ldots, x|x|^{K-1}] \begin{bmatrix} a_1 \\ a_3 \\ \vdots \\ a_K \end{bmatrix} = H\theta,$$

where y may represent the received signal, x may represent the analog signal generated by the gNB 110, $a_i$ may represent a coefficient associated with the $i^{th}$ powered kernel, $x|x|^{(i-1)}$ may represent the $i^{th}$ powered kernel, and K may determine a quantity of coefficients and odd powered kernels that are used. Accordingly, H may represent the kernel matrix and θ may represent the coefficient vector.

The UE 120 and/or the gNB 110 may estimate the coefficients according to an expression similar to the form $$\hat{\theta}_{LS}=(H^H H)^{-1} H^H y,$$

where $\hat{\theta}_{LS}$ may represent the estimated coefficients (e.g., estimated via a least squares estimation), H may represent the kernel matrix, $H^H$ may represent the Hermitian conjugate of the kernel matrix, and y may represent the received signal as a vector.

The UE 120 may further estimate a portion of the received signal that includes a distortion using a model 311 associated with the PA. The distortion may be represented by d in example 300. For example, the UE 120 may apply non-linear distortion estimation using an expression similar to the form $$d=\text{PA\_model}(\hat{x})=\Sigma_{i=1,i=odd}^{K} a_i \hat{x}|\hat{x}|^{(i-1)},$$

where d may represent the distortion, PA_model may represent the model 311 that accepts an estimated data signal as input and that outputs an estimated non-linearly distorted signal that would be generated by the PA, 2 may represent the estimated portion including the original data signal, $a_i$ may represent a coefficient associated with the $i^{th}$ powered kernel, $\hat{x}|\hat{x}|^{(i-1)}$ may represent the $i^{th}$ powered kernel, and K may determine a quantity of coefficients and odd powered kernels that are used. Accordingly, as shown in connection with reference number 315, the UE 120 may generate a reconstructed signal that may be represented by a form similar to $$y-d-\Sigma_{i=3,i=odd}^{K} a_i \hat{x}|\hat{x}|^{(i-1)}.$$

As shown in connection with reference number 313, the portion including the original data signal and the portion including the distortion may be estimated iteratively. For example, in a second iteration, the UE 120 may re-estimate the portion including the original data signal based at least in part on a corrected signal output from a first iteration. The corrected signal output from the first iteration may be represented by a form similar to $$y_{corrected}=y-\hat{d}$$

where $y_{corrected}$ may represent the corrected signal, y may represent the received signal, and $\hat{d}$ may represent the residual distortion from the first iteration.

In the second iteration, the UE 120 may further re-estimate the distortion based at least in part on the re-estimated portion including the original data signal. Although described with respect to two iterations, the UE 120 may use additional iterations, such as three, four, and so on. In some aspects, the UE 120 may determine convergence statically (e.g., based at least in part on a preconfigured quantity of iterations). Additionally, or alternatively, the UE 120 may determine convergence dynamically (e.g., based at least in part on a change in reconstructed signals, whether in magnitude and/or direction, across two or more iterations satisfying a threshold). In a combinatory example, the UE 120 may determine convergence dynamically subject to a preconfigured maximum quantity of iterations.

The UE 120 may thus generate a reconstructed signal based at least in part on the received signal, the estimated portion including the original data signal, and the estimated portion including the distortion. Accordingly, a reception broadband (Rx BB) 317 may demodulate and decode the reconstructed signal. By using techniques as described in connection with FIG. 3, the UE 120 performs more accurate digital post-distortion. Increasing the accuracy in turn increases chances of successfully decoding the reconstructed signal. Successfully decoded signals do not need to be re-transmitted by the gNB 110, which conserves power and processing resources at the gNB 110, as well as conserving networking overhead. Additionally, the UE 120 conserves power and processing resources as compared with having to receive and decode re-transmitted signals.

As indicated above, FIG. 3 is provided as an example. Other examples may differ from what is described with respect to FIG. 3.

Figure 4:
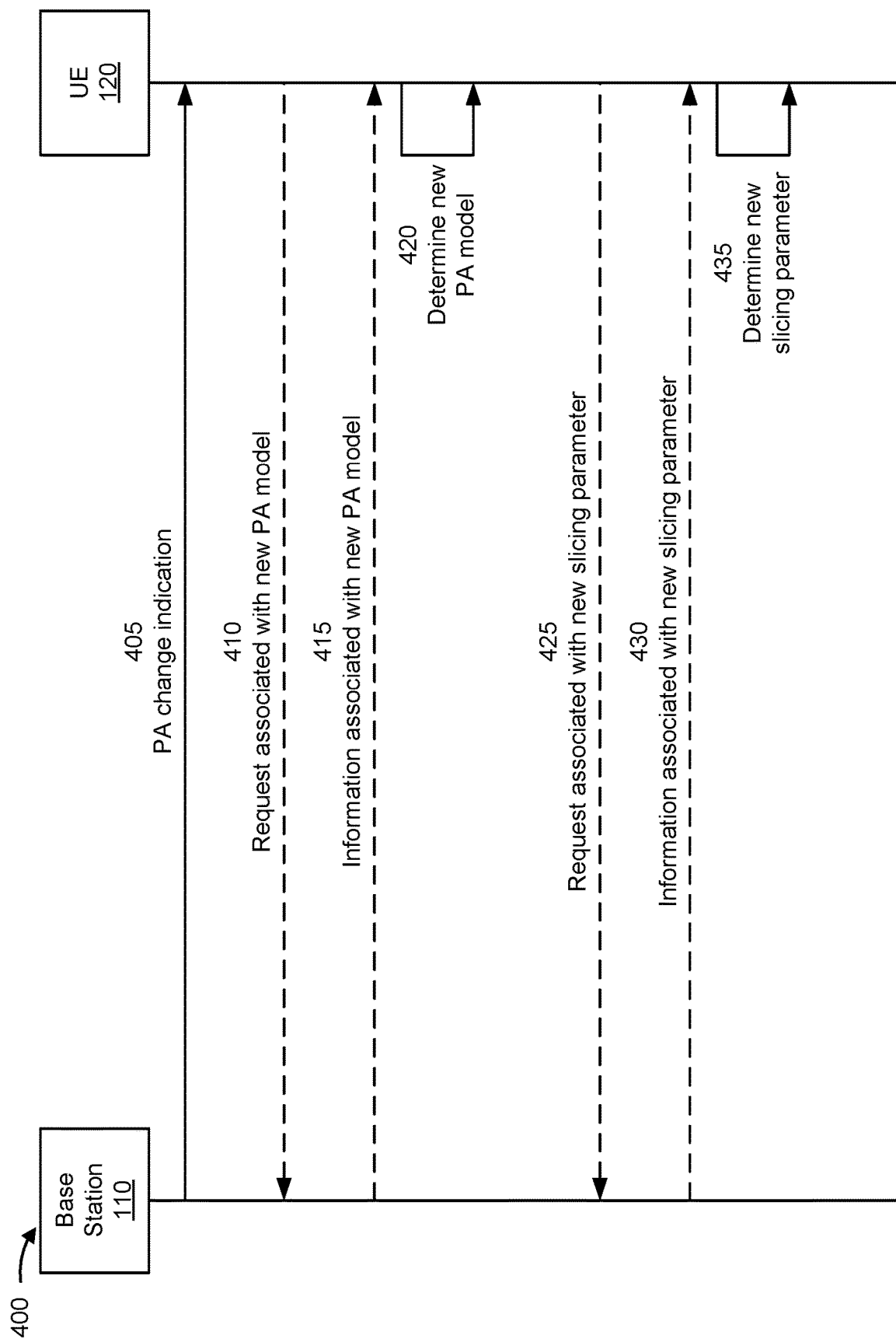
FIG. 4 is a diagram illustrating an example associated with signaling for high-order DPoD, in accordance with the present disclosure.

FIG. 4 is a diagram illustrating an example 400 associated with signaling related to high-order digital post-distortion, in accordance with the present disclosure. As shown in FIG. 4, a base station 110 and a UE 120 may communicate with one another. In some aspects, the gNB 110 and the UE 120 may communicate using a wireless network, such as wireless network 100.

As shown in connection with reference number 405, the base station 110 may transmit, and the UE 120 may receive, an indication of a change in a non-linearity model associated with a PA of the base station 110. For example, the base station 110 may determine the change based at least in part on an environmental change (e.g., a temperature change and/or a humidity change), a transmission property change (e.g., a frequency change, a beam change, a phase change, and/or another physical change associated with transmitted signals from the base station 110), a power change associated with the PA (e.g., a voltage change and/or a current change), and/or another changes detected by the base station 110 associated with the PA. The indication may be one or more bits indicative that the change exists or may include one or more indicators associated with a cause of the change.

In some aspects, and as shown in connection with reference number 410, the UE 120 may transmit, and the base station 110 may receive, a request associated with updating a model that is associated with the PA (e.g., used to estimate distortion as described above in connection with FIG. 3). For example, the UE 120 may request a new model that will replace the original model. As an alternative, the UE 120 may request kernels associated with the model such that the UE 120 may update the model using the kernels. The request may be one or more bits indicative that the UE 120 requests information associated with updating the model or may include one or more indicators whether the UE 120 is requesting the new model or only the kernels.

As shown in connection with reference number 415, the base station 110 may transmit, and the UE 120 may receive, an indication of the new model. The base station 110 may transmit the indication of the new model based at least in part on the request described above in connection with reference number 410. As an alternative, the base station 110 may transmit the indication of the new model in combination with or after transmitting the indication of the change as described above in connection with reference number 405.

In some aspects, the indication may include a look-up table (LUT) such that the UE 120 may map the indication of the change to kernels and coefficients that the UE 120 may use to update the model. Similarly, the indication may include one or more vectors such that the UE 120 may map the indication of the change to kernels and coefficients (e.g., using LUTs and/or other indices) that the UE 120 may use to update the model.

As an alternative, the base station 110 may transmit, and the UE 120 may receive, an indication of a kernel series and coefficients used to update the model. For example, the indication may be associated with a Volterra polynomial and/or another kernel series as well as the coefficients for using with the kernel series. The base station 110 may transmit the indication of the kernel series and the coefficients based at least in part on the request described above in connection with reference number 410. As an alternative, the base station 110 may transmit the indication of the kernel series and the coefficients in combination with or after transmitting the indication of the change as described above in connection with reference number 405.

As an alternative, the base station 110 may transmit, and the UE 120 may receive, an indication of the kernels used to update the model, and the UE 120 may determine the coefficients (e.g., as described below) when updating the model. The base station 110 may transmit the indication of the kernels based at least in part on the request described above in connection with reference number 410. As an alternative, the base station 110 may transmit the indication of the kernels in combination with or after transmitting the indication of the change as described above in connection with reference number 405.

As shown in connection with reference number 420, the UE 120 may update the model associated with the PA based at least in part on the indication described above in connection with reference number 405. In some aspects, the UE 120 replaces the model with a new model indicated by the base station 110 as described above in connection with reference number 415. As an alternative, the UE 120 updates the model using a kernel series and coefficients indicated by the base station 110 as described above in connection with reference number 415.

In some aspects, the UE 120 updates the model based at least in part on one or more pilots received from the base station 110. For example, the UE 120 may receive kernels used to update the model from the base station 110, as described above in connection with reference number 415, and may estimate coefficients associated with the model based at least in part on the pilot(s).

As shown in connection with reference number 425, the UE 120 may transmit, and the base station 110 may receive, a request associated with updating at least one parameter associated with slicing received signals (e.g., as described above in connection with FIG. 3). For example, the UE 120 may request at least one new parameter to replace at least one original parameter.

In some aspects, and as shown in connection with reference number 430, the base station 110 may transmit, and the UE 120 may receive, an indication of the at least one new parameter. The base station 110 may transmit the indication of the at least one new parameter based at least in part on the request described above in connection with reference number 425. As an alternative, the base station 110 may transmit the indication of the at least one new parameter in combination with or after transmitting the indication of the change as described above in connection with reference number 405.

In some aspects, the indication may include an LUT such that the UE 120 may map the indication of the change to at least one new kernel such that the UE 120 may use the at least one new kernel as the at least one new parameter. As an alternative, the indication may include an indication of a kernel series such that the UE 120 may use the kernel series as the at least one new parameter. Additionally, in some aspects, the base station 110 may transmit, and the UE 120 may receive, an indication of coefficients associated with the kernel series. Accordingly, the UE 120 may additionally use the coefficients as the at least one new parameter.

As shown in connection with reference number 435, the UE 120 may update the at least one parameter associated with slicing received signals based at least in part on the indication described above in connection with reference number 405. For example, the UE 120 may replace the at least one parameter with the at least one new parameter indicated by the base station 110 (e.g., as described above in connection with reference number 430). As described above in connection with FIG. 3, the at least one parameter may be associated with a Bussgang decomposition. In some aspects, the received signals may include single-carrier waveforms from the base station 110.

In some aspects, the UE 120 updates the at least one parameter based at least in part on one or more pilots received from the base station 110. For example, the UE 120 may receive kernels associated with the model from the base station 110, as described above in connection with reference number 430, and may estimate coefficients associated with the model based at least in part on the pilot(s). Accordingly, in one example, the UE 120 may solve for a coefficient vector (e.g., represented by $\hat{\theta}_{LS}$) according to an expression of a form similar to $$(H^H H)^{-1} H^H y,$$

where H may represent a matrix of the kernels indicated by the base station 110, $H^H$ may represent the Hermitian conjugate of the kernel matrix, and y may represent the pilot(s) received by the UE 120.

Additionally, or alternatively, the UE 120 updates the at least one parameter based at least in part on the model associated with the PA. For example, the UE 120 may use the model associated with the PA to estimate kernels and coefficients to use when slicing received signals. In some aspects, the model used to perform slicing may include a truncated model based at least in part on a full non-linearity model associated with the PA. For example, the full model may include memory elements that are omitted from the truncated model. Accordingly, the UE 120 may perform digital post-distortion (e.g., as described above in connection with FIG. 3) using the updated model associated with the PA and the updated parameter(s) associated with slicing.

By using techniques as described in connection with FIG. 4, the UE 120 can perform more accurate digital post-distortion (e.g., as described above in connection with FIG. 3). Increasing the accuracy in turn increases chances of successfully decoding the reconstructed signal. Successfully decoded signals do not need to be re-transmitted by the base station 110, which conserves power and processing resources at the base station 110, as well as conserving networking overhead. Additionally, the UE 120 conserves power and processing resources as compared with having to receive and decode re-transmitted signals.

As indicated above, FIG. 4 is provided as an example. Other examples may differ from what is described with respect to FIG. 4.

Figure 5:
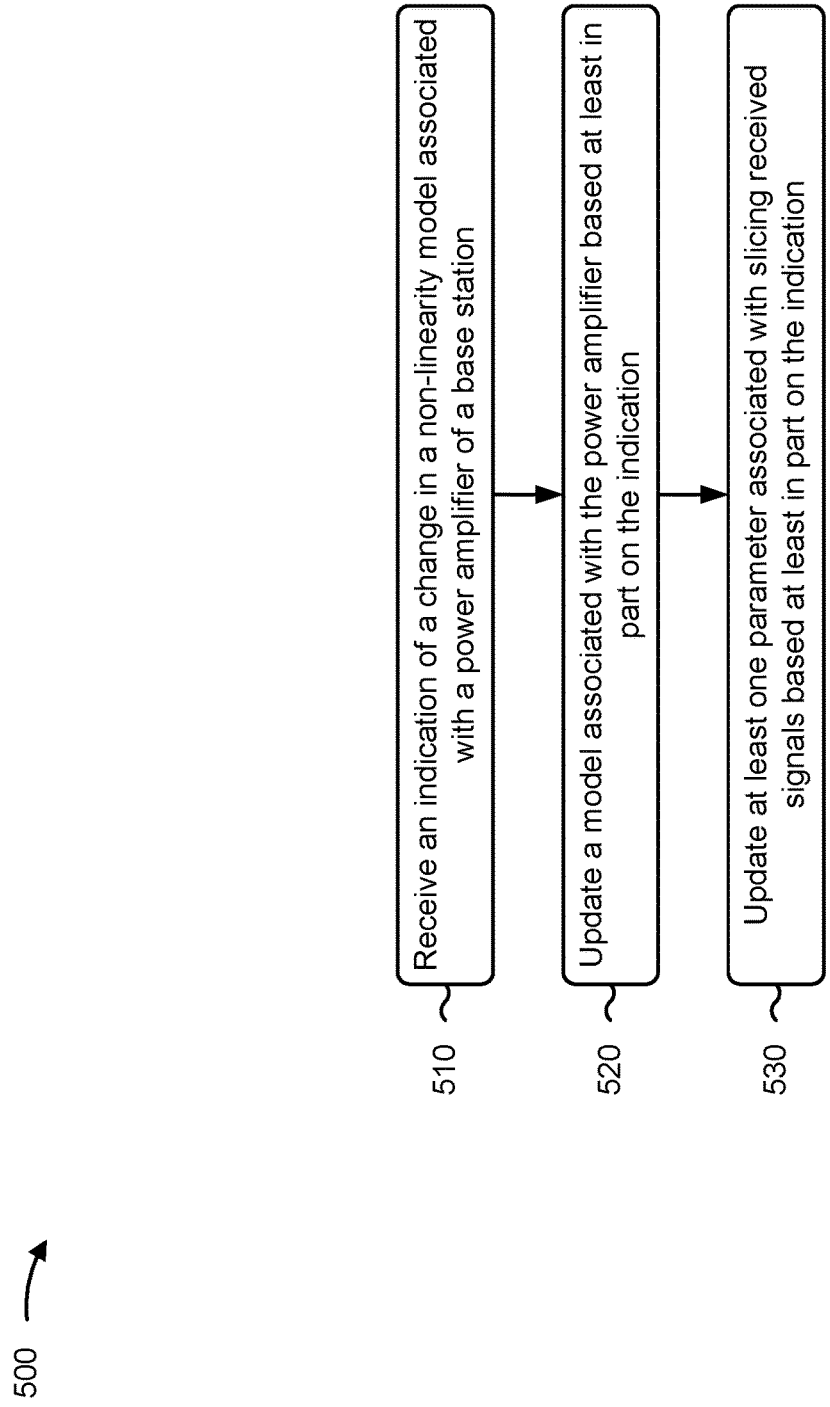
FIGS. 5, 6, and 7 are diagrams illustrating example processes associated with performing high-order DPoD, in accordance with the present disclosure.

FIG. 5 is a diagram illustrating an example process 500 performed, for example, by a UE, in accordance with the present disclosure. Example process 500 is an example where the UE (e.g., UE 120 and/or apparatus 800 of FIG. 8) performs operations associated with performing high-order DPoD.

As shown in FIG. 5, in some aspects, process 500 may include receiving, from a base station (e.g., base station 110 and/or apparatus 900 of FIG. 9), an indication of a change in a non-linearity model associated with a power amplifier of the base station (block 510). For example, the UE (e.g., using communication manager 140 and/or reception component 802, depicted in FIG. 8) may receive, from a base station, an indication of a change in a non-linearity model associated with a power amplifier of the base station, as described herein.

As further shown in FIG. 5, in some aspects, process 500 may include updating a model associated with the power amplifier based at least in part on the indication (block 520). For example, the UE (e.g., using communication manager 140 and/or determination component 808, depicted in FIG. 8) may update a model associated with the power amplifier based at least in part on the indication, as described herein.

As further shown in FIG. 5, in some aspects, process 500 may include updating at least one parameter associated with slicing received signals based at least in part on the indication (block 530). For example, the UE (e.g., using communication manager 140 and/or determination component 808) may update at least one parameter associated with slicing received signals based at least in part on the indication, as described herein.

Process 500 may include additional aspects, such as any single aspect or any combination of aspects described below and/or in connection with one or more other processes described elsewhere herein.

In a first aspect, the model and the at least one parameter are updated based at least in part on one or more pilots received from the base station.

In a second aspect, alone or in combination with the first aspect, process 500 further includes receiving (e.g., using communication manager 140 and/or reception component 802), from the base station, an indication of a new model, where the model is updated based at least in part on the new model.

In a third aspect, alone or in combination with one or more of the first and second aspects, the indication includes one or more of a look-up table, one or more vectors of look-up tables, or an indication of a kernel series and coefficients.

In a fourth aspect, alone or in combination with one or more of the first through third aspects, process 500 further includes transmitting (e.g., using communication manager 140 and/or transmission component 804, depicted in FIG. 4), to the base station, a request for the new model, where the indication of the new model is received based at least in part on the request.

In a fifth aspect, alone or in combination with one or more of the first through fourth aspects, process 500 further includes receiving (e.g., using communication manager 140 and/or reception component 802), from the base station, an indication of kernels, where the model is updated based at least in part on the kernels, and receiving (e.g., using communication manager 140 and/or reception component 802), from the base station, one or more pilots, where coefficients associated with the model are updated based at least in part on the one or more pilots.

In a sixth aspect, alone or in combination with one or more of the first through fifth aspects, process 500 further includes transmitting (e.g., using communication manager 140 and/or transmission component 804), to the base station, a request for the kernels, where the indication of the kernels is received based at least in part on the request.

In a seventh aspect, alone or in combination with one or more of the first through sixth aspects, the at least one parameter is updated based at least in part on the updated model.

In an eighth aspect, alone or in combination with one or more of the first through seventh aspects, process 500 further includes receiving (e.g., using communication manager 140 and/or reception component 802), from the base station, an indication of at least one new parameter, where the at least one parameter is updated based at least in part on the at least one new parameter.

In a ninth aspect, alone or in combination with one or more of the first through eighth aspects, the indication includes one or more of a look-up table or an indication of a kernel series.

In a tenth aspect, alone or in combination with one or more of the first through ninth aspects, process 500 further includes transmitting (e.g., using communication manager 140 and/or transmission component 804), to the base station, a request for the at least one new parameter, where the indication of the at least one new parameter is received based at least in part on the request.

In an eleventh aspect, alone or in combination with one or more of the first through tenth aspects, the at least one parameter is associated with a Bussgang decomposition.

In a twelfth aspect, alone or in combination with one or more of the first through eleventh aspects, the received signals include single-carrier waveforms.

Although FIG. 5 shows example blocks of process 500, in some aspects, process 500 may include additional blocks, fewer blocks, different blocks, or differently arranged blocks than those depicted in FIG. 5. Additionally, or alternatively, two or more of the blocks of process 500 may be performed in parallel.

Figure 6:
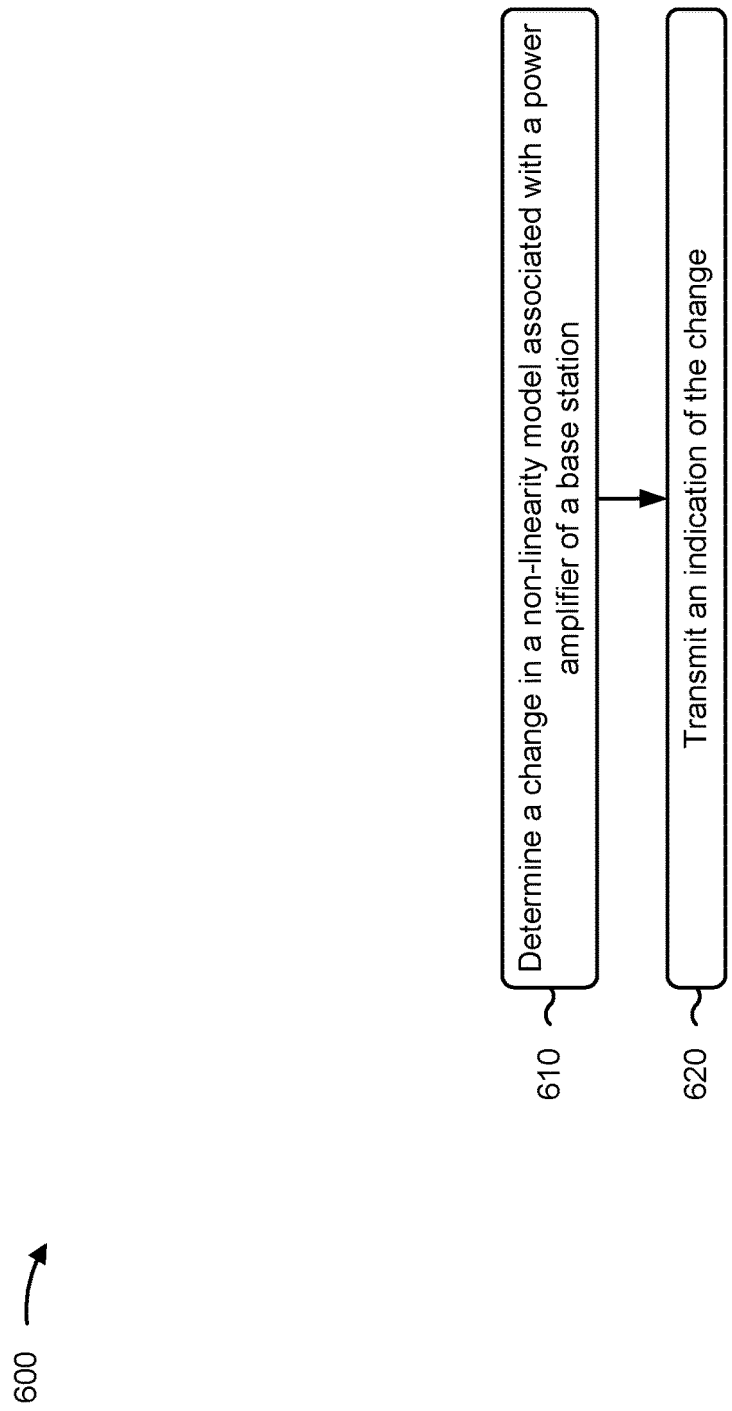

FIG. 6 is a diagram illustrating an example process 600 performed, for example, by a base station, in accordance with the present disclosure. Example process 600 is an example where the base station (e.g., base station 110 and/or apparatus 900 of FIG. 9) performs operations associated with performing high-order DPoD.

As shown in FIG. 6, in some aspects, process 600 may include determining a change in a non-linearity model associated with a power amplifier of the base station (block 610). For example, the base station (e.g., using communication manager 150 and/or determination component 908, depicted in FIG. 9) may determine a change in a non-linearity model associated with a power amplifier of the base station, as described herein.

As further shown in FIG. 6, in some aspects, process 600 may include transmitting, to a UE (e.g., UE 120 and/or apparatus 800 of FIG. 8), an indication of the change (block 620). For example, the base station (e.g., using communication manager 150 and/or transmission component 904, depicted in FIG. 9) may transmit, to a UE, an indication of the change, as described herein.

Process 600 may include additional aspects, such as any single aspect or any combination of aspects described below and/or in connection with one or more other processes described elsewhere herein.

In a first aspect, process 600 further includes transmitting (e.g., using communication manager 150 and/or transmission component 904), to the UE, one or more pilots for updating a model associated with the power amplifier.

In a second aspect, alone or in combination with the first aspect, process 600 further includes transmitting (e.g., using communication manager 150 and/or transmission component 904), to the UE, an indication of a model associated with the power amplifier.

In a third aspect, alone or in combination with one or more of the first and second aspects, the indication includes one or more of a look-up table, one or more vectors of look-up tables, or an indication of a kernel series and coefficients.

Figure 9:
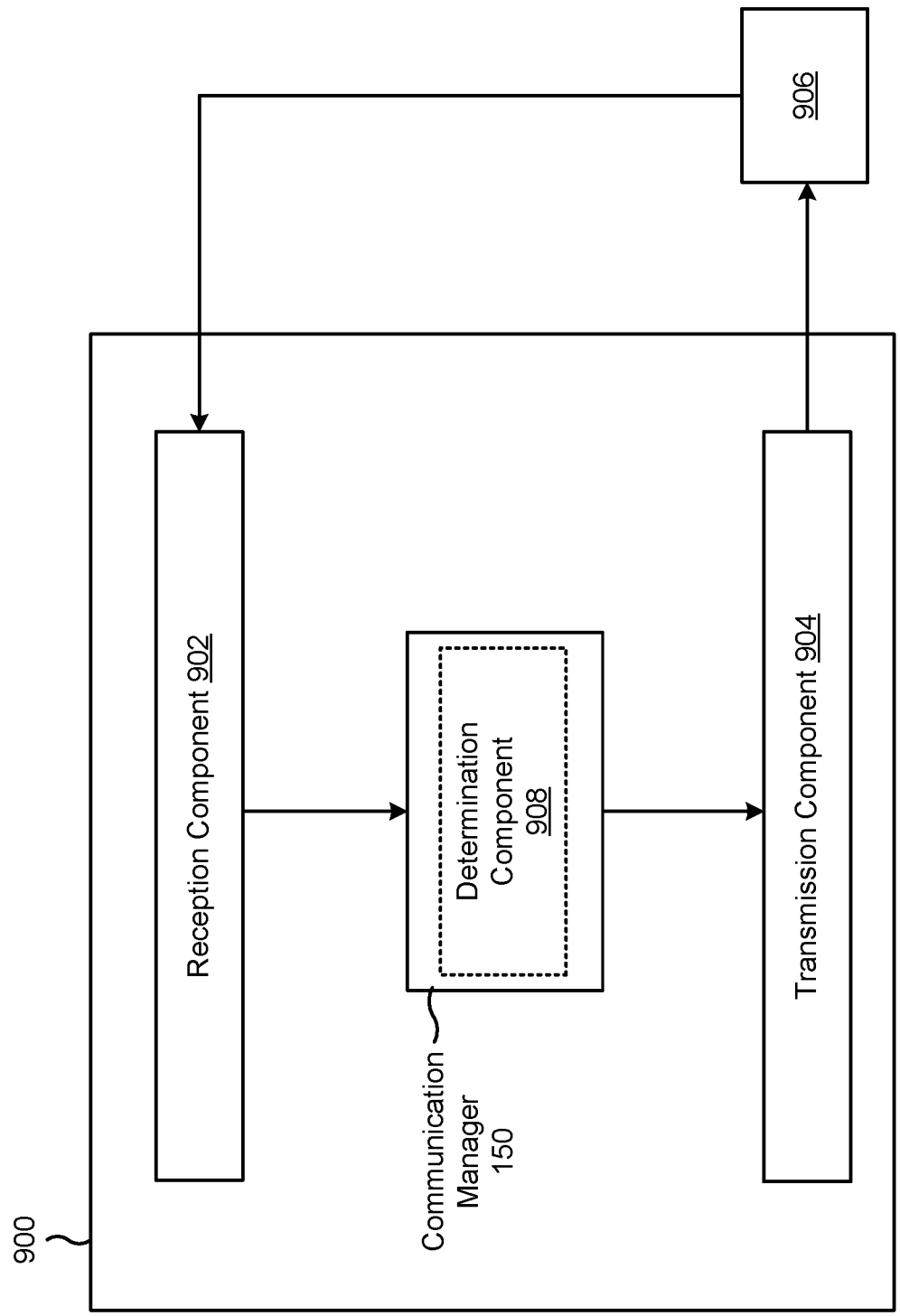

In a fourth aspect, alone or in combination with one or more of the first through third aspects, process 600 further includes receiving (e.g., using communication manager 150 and/or reception component 902, depicted in FIG. 9), from the UE, a request for the model, where the indication of the model is transmitted based at least in part on the request.

In a fifth aspect, alone or in combination with one or more of the first through fourth aspects, process 600 further includes transmitting (e.g., using communication manager 150 and/or transmission component 904), to the UE, an indication of kernels for updating a model associated with the power amplifier, and transmitting (e.g., using communication manager 150 and/or transmission component 904), to the UE, one or more pilots for updating coefficients associated with the model.

In a sixth aspect, alone or in combination with one or more of the first through fifth aspects, process 600 further includes receiving (e.g., using communication manager 150 and/or reception component 902), from the UE, a request for the kernels, where the indication of the kernels is transmitted based at least in part on the request.

In a seventh aspect, alone or in combination with one or more of the first through sixth aspects, process 600 further includes transmitting (e.g., using communication manager 150 and/or transmission component 904), to the UE, an indication of at least one parameter to use for slicing signals from the base station.

In an eighth aspect, alone or in combination with one or more of the first through seventh aspects, the indication includes one or more of a look-up table or an indication of a kernel series.

In a ninth aspect, alone or in combination with one or more of the first through eighth aspects, process 600 further includes receiving (e.g., using communication manager 150 and/or reception component 902), from the UE, a request for the at least one parameter, where the indication of the at least one parameter is transmitted based at least in part on the request.

In a tenth aspect, alone or in combination with one or more of the first through ninth aspects, the at least one parameter is associated with a Bussgang decomposition.

In an eleventh aspect, alone or in combination with one or more of the first through tenth aspects, the signals from the base station include single-carrier waveforms.

Although FIG. 6 shows example blocks of process 600, in some aspects, process 600 may include additional blocks, fewer blocks, different blocks, or differently arranged blocks than those depicted in FIG. 6. Additionally, or alternatively, two or more of the blocks of process 600 may be performed in parallel.

Figure 7:
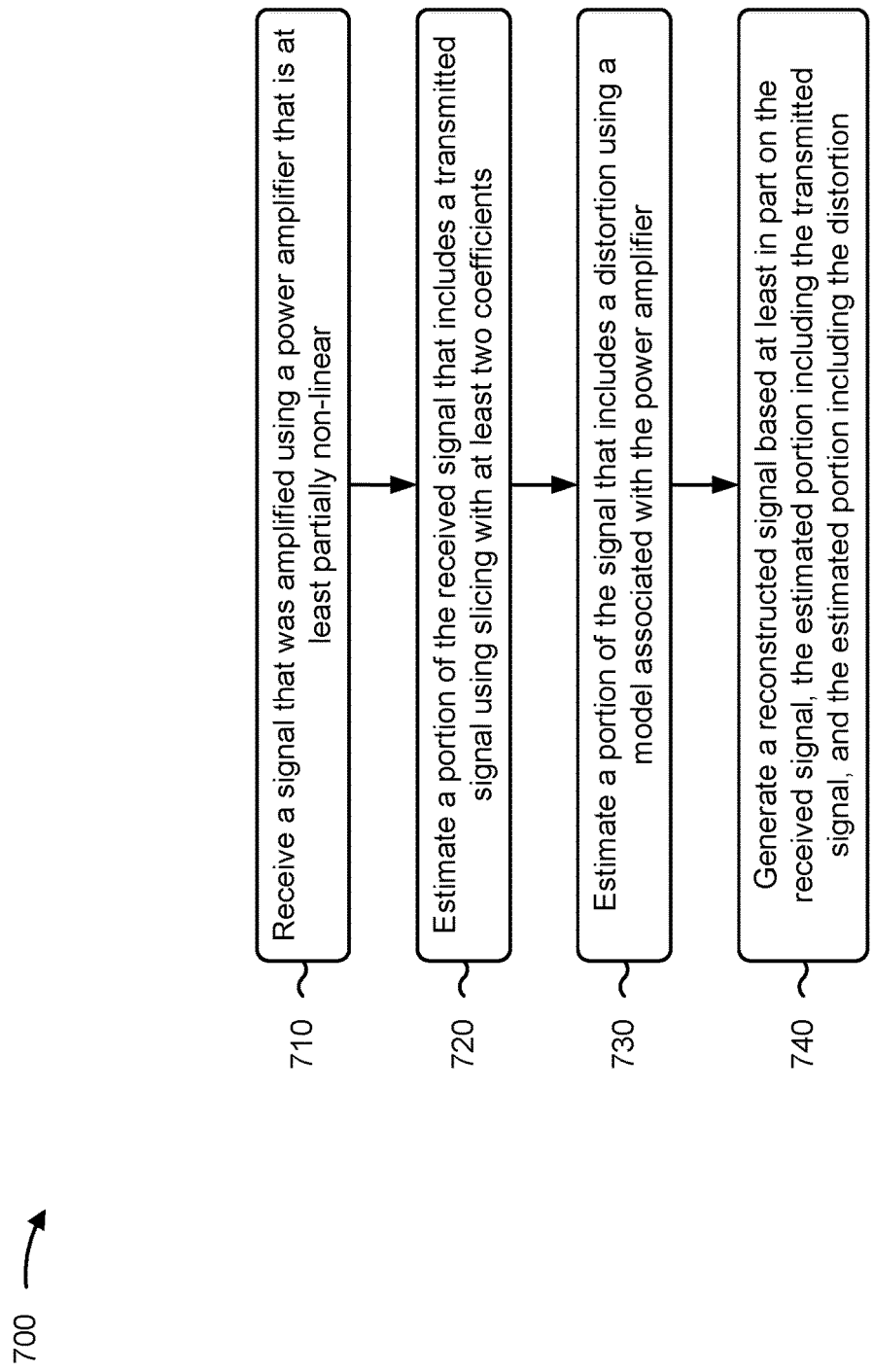

FIG. 7 is a diagram illustrating an example process 700 performed, for example, by a UE, in accordance with the present disclosure. Example process 700 is an example where the UE (e.g., UE 120 and/or apparatus 800 of FIG. 8) performs operations associated with performing high-order DPoD.

As shown in FIG. 7, in some aspects, process 700 may include receiving, from a base station (e.g., base station 110 and/or apparatus 900 of FIG. 9), a signal that was amplified using a power amplifier that is at least partially non-linear (block 710). For example, the UE (e.g., using communication manager 140 and/or reception component 802, depicted in FIG. 8) may receive, from a base station, a signal that was amplified using a power amplifier that is at least partially non-linear, as described herein.

As further shown in FIG. 7, in some aspects, process 700 may include estimating a portion of the received signal that includes an original data signal using slicing with at least two coefficients (block 720). For example, the UE (e.g., using communication manager 140 and/or estimation component 810, depicted in FIG. 8) may estimate a portion of the received signal that includes an original data signal using slicing with at least two coefficients, as described herein.

As further shown in FIG. 7, in some aspects, process 700 may include estimating a portion of the signal that includes a distortion using a model associated with the power amplifier (block 730). For example, the UE (e.g., using communication manager 140 and/or estimation component 810) may estimate a portion of the signal that includes a distortion using a model associated with the power amplifier, as described herein.

As further shown in FIG. 7, in some aspects, process 700 may include generating a reconstructed signal based at least in part on the received signal, the estimated portion including the original data signal, and the estimated portion including the distortion (block 740). For example, the UE (e.g., using communication manager 140 and/or reconstruction component 812, depicted in FIG. 8) may generate a reconstructed signal based at least in part on the received signal, the estimated portion including the original data signal, and the estimated portion including the distortion, as described herein.

Process 700 may include additional aspects, such as any single aspect or any combination of aspects described below and/or in connection with one or more other processes described elsewhere herein.

In a first aspect, the portion including the original data signal and the portion including the distortion are estimated iteratively.

In a second aspect, alone or in combination with the first aspect, the signal includes single-carrier waveforms.

In a third aspect, alone or in combination with one or more of the first and second aspects, the slicing uses a plurality of odd powers with the at least two coefficients.

In a fourth aspect, alone or in combination with one or more of the first through third aspects, the slicing and estimation of the portion including the distortion are based at least in part on a Bussgang decomposition.

Although FIG. 7 shows example blocks of process 700, in some aspects, process 700 may include additional blocks, fewer blocks, different blocks, or differently arranged blocks than those depicted in FIG. 7. Additionally, or alternatively, two or more of the blocks of process 700 may be performed in parallel.

Figure 8:
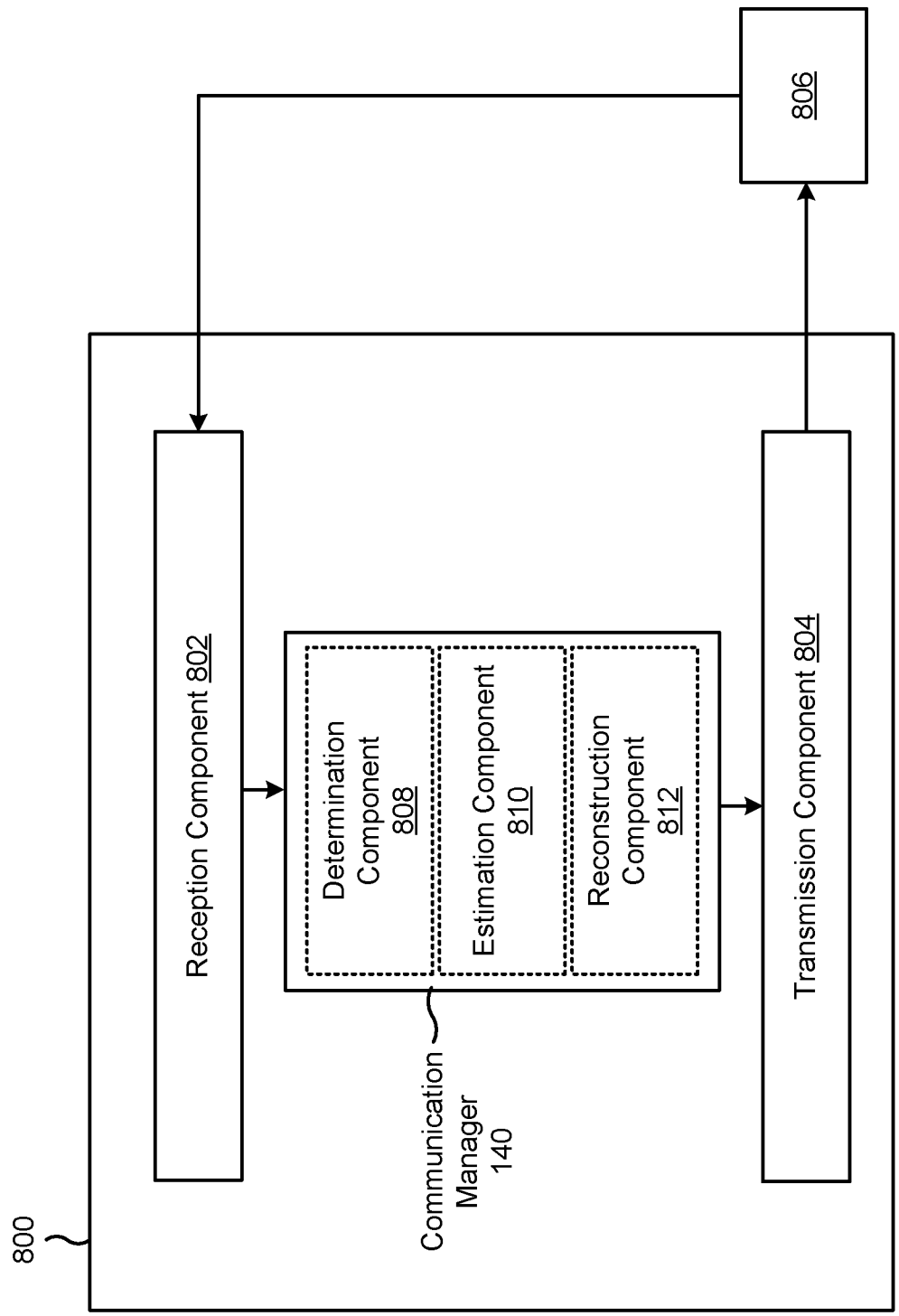
FIGS. 8 and 9 are block diagrams of example apparatuses for wireless communication, in accordance with the present disclosure.

FIG. 8 is a block diagram of an example apparatus 800 for wireless communication. The apparatus 800 may be a UE, or a UE may include the apparatus 800. In some aspects, the apparatus 800 includes a reception component 802 and a transmission component 804, which may be in communication with one another (for example, via one or more buses and/or one or more other components). As shown, the apparatus 800 may communicate with another apparatus 806 (such as a UE, a base station, or another wireless communication device) using the reception component 802 and the transmission component 804. As further shown, the apparatus 800 may include the communication manager 140. The communication manager 140 may include one or more of a determination component 808, an estimation component 810, or a reconstruction component 812, among other examples.

In some aspects, the apparatus 800 may be configured to perform one or more operations described herein in connection with FIGS. 3-4. Additionally, or alternatively, the apparatus 800 may be configured to perform one or more processes described herein, such as process 500 of FIG. 5, process 700 of FIG. 7, or a combination thereof. In some aspects, the apparatus 800 and/or one or more components shown in FIG. 8 may include one or more components of the UE described in connection with FIG. 2. Additionally, or alternatively, one or more components shown in FIG. 8 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 802 may receive communications, such as reference signals, control information, data communications, or a combination thereof, from the apparatus 806. The reception component 802 may provide received communications to one or more other components of the apparatus 800. In some aspects, the reception component 802 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 800. In some aspects, the reception component 802 may include one or more antennas, a demodulator, a MIMO detector, a receive processor, a controller/processor, a memory, or a combination thereof, of the UE described in connection with FIG. 2.

The transmission component 804 may transmit communications, such as reference signals, control information, data communications, or a combination thereof, to the apparatus 806. In some aspects, one or more other components of the apparatus 800 may generate communications and may provide the generated communications to the transmission component 804 for transmission to the apparatus 806. In some aspects, the transmission component 804 may perform signal processing on the generated communications (such as filtering, amplification, modulation, digital-to-analog conversion, multiplexing, interleaving, mapping, or encoding, among other examples), and may transmit the processed signals to the apparatus 806. In some aspects, the transmission component 804 may include one or more antennas, a modulator, a transmit MIMO processor, a transmit processor, a controller/processor, a memory, or a combination thereof, of the UE described in connection with FIG. 2. In some aspects, the transmission component 804 may be co-located with the reception component 802 in a transceiver.

In some aspects, the reception component 802 may receive (e.g., from the apparatus 806) an indication of a change in a non-linearity model associated with a power amplifier of the apparatus 806. Accordingly, the determination component 808 may update a model associated with the power amplifier based at least in part on the indication. The determination component 808 may include a MIMO detector, a receive processor, a transmit MIMO processor, a transmit processor, a controller/processor, a memory, or a combination thereof, of the UE described in connection with FIG. 2. In some aspects, the reception component 802 may receive (e.g., from the apparatus 806) an indication of a new model, such that the determination component 808 updates the model based at least in part on the new model. Additionally, in some aspects, the transmission component 804 may transmit (e.g., to the apparatus 806) a request for the new model, such that the reception component 802 receives the indication of the new model based at least in part on the request.

As an alternative, the reception component 802 may receive (e.g., from the apparatus 806) an indication of kernels, such that the determination component 808 updates the model based at least in part on the kernels. Additionally, the reception component 802 may receive (e.g., from the apparatus 806) one or more pilots, such that the determination component 808 updates coefficients associated with the model based at least in part on the one or more pilots. In some aspects, the transmission component 804 may transmit (e.g., to the apparatus 806) a request for the kernels, such that the reception component 802 receives the indication of the kernels based at least in part on the request.

Additionally, the determination component 808 may update at least one parameter associated with slicing received signals based at least in part on the indication. In some aspects, the reception component 802 may receive (e.g., from the apparatus 806) an indication of at least one new parameter, such that the determination component 808 updates the at least one parameter based at least in part on the at least one new parameter. Additionally, in some aspects, the transmission component 804 may transmit (e.g., to the apparatus 806) a request for the at least one new parameter, such that the reception component 802 receives the indication of the at least one new parameter based at least in part on the request.

Accordingly, in some aspects, the reception component 802 may receive (e.g., from the apparatus 806), a signal that was amplified using a power amplifier that is at least partially non-linear. The estimation component 810 may estimate a portion of the received signal that includes an original data signal using slicing with at least two coefficients and may estimate a portion of the signal that includes a distortion using a model associated with the power amplifier. The estimation component 810 may include a MIMO detector, a receive processor, a transmit MIMO processor, a transmit processor, a controller/processor, a memory, or a combination thereof, of the UE described in connection with FIG. 2. Additionally, the reconstruction component 812 may generate a reconstructed signal based at least in part on the received signal, the estimated portion including the original data signal, and the estimated portion including the distortion. The reconstruction component 812 may include a MIMO detector, a receive processor, a demodulator, a controller/processor, a memory, or a combination thereof, of the UE described in connection with FIG. 2.

The number and arrangement of components shown in FIG. 8 are provided as an example. In practice, there may be additional components, fewer components, different components, or differently arranged components than those shown in FIG. 8. Furthermore, two or more components shown in FIG. 8 may be implemented within a single component, or a single component shown in FIG. 8 may be implemented as multiple, distributed components. Additionally, or alternatively, a set of (one or more) components shown in FIG. 8 may perform one or more functions described as being performed by another set of components shown in FIG. 8.

FIG. 9 is a block diagram of an example apparatus 900 for wireless communication. The apparatus 900 may be a base station, or a base station may include the apparatus 900. In some aspects, the apparatus 900 includes a reception component 902 and a transmission component 904, which may be in communication with one another (for example, via one or more buses and/or one or more other components). As shown, the apparatus 900 may communicate with another apparatus 906 (such as a UE, a base station, or another wireless communication device) using the reception component 902 and the transmission component 904. As further shown, the apparatus 900 may include the communication manager 150. The communication manager 150 may include a determination component 908, among other examples.

In some aspects, the apparatus 900 may be configured to perform one or more operations described herein in connection with FIGS. 3-4. Additionally, or alternatively, the apparatus 900 may be configured to perform one or more processes described herein, such as process 600 of FIG. 6, or a combination thereof. In some aspects, the apparatus 900 and/or one or more components shown in FIG. 9 may include one or more components of the base station described in connection with FIG. 2. Additionally, or alternatively, one or more components shown in FIG. 9 may be implemented within one or more components described in connection with FIG. 2. Additionally, or alternatively, one or more components of the set of components may be implemented at least in part as software stored in a memory. For example, a component (or a portion of a component) may be implemented as instructions or code stored in a non-transitory computer-readable medium and executable by a controller or a processor to perform the functions or operations of the component.

The reception component 902 may receive communications, such as reference signals, control information, data communications, or a combination thereof, from the apparatus 906. The reception component 902 may provide received communications to one or more other components of the apparatus 900. In some aspects, the reception component 902 may perform signal processing on the received communications (such as filtering, amplification, demodulation, analog-to-digital conversion, demultiplexing, deinterleaving, de-mapping, equalization, interference cancellation, or decoding, among other examples), and may provide the processed signals to the one or more other components of the apparatus 906. In some aspects, the reception component 902 may include one or more antennas, a demodulator, a MIMO detector, a receive processor, a controller/processor, a memory, or a combination thereof, of the base station described in connection with FIG. 2.

The transmission component 904 may transmit communications, such as reference signals, control information, data communications, or a combination thereof, to the apparatus 906. In some aspects, one or more other components of the apparatus 906 may generate communications and may provide the generated communications to the transmission component 904 for transmission to the apparatus 906. In some aspects, the transmission component 904 may perform signal processing on the generated communications (such as filtering, amplification, modulation, digital-to-analog conversion, multiplexing, interleaving, mapping, or encoding, among other examples), and may transmit the processed signals to the apparatus 906. In some aspects, the transmission component 904 may include one or more antennas, a modulator, a transmit MIMO processor, a transmit processor, a controller/processor, a memory, or a combination thereof, of the base station described in connection with FIG. 2. In some aspects, the transmission component 904 may be co-located with the reception component 902 in a transceiver.

In some aspects, the determination component 908 may determine a change in a non-linearity model associated with a power amplifier of the apparatus 900. The determination component 908 may include a transmit MIMO processor, a transmit processor, a MIMO detector, a receive processor, a controller/processor, a memory, or a combination thereof, of the base station described in connection with FIG. 2. Accordingly, the transmission component 904 may transmit (e.g., to the apparatus 906) an indication of the change.

In some aspects, the transmission component 904 may additionally transmit (e.g., to the apparatus 906) one or more pilots for updating a model associated with the power amplifier. Additionally, or alternatively, the transmission component 904 may transmit (e.g., to the apparatus 906) an indication of kernels for updating a model associated with the power amplifier. Accordingly, the one or more pilots may be for updating coefficients associated with the model. Additionally, in some aspects, the reception component 902 may receive (e.g., from the apparatus 906) a request for the kernels, such that the transmission component 904 transmits the indication of the kernels based at least in part on the request.

As an alternative, the transmission component 904 may transmit (e.g., to the apparatus 906) an indication of a model associated with the power amplifier. Additionally, in some aspects, the reception component 902 may receive (e.g., from the apparatus 906) a request for the model, such that the transmission component 904 transmits the indication of the model based at least in part on the request.

Additionally, or alternatively, in some aspects, the transmission component 904 may transmit (e.g., to the apparatus 906) an indication of at least one parameter to use for slicing signals from the apparatus 900. In some aspects, the reception component 902 may receive (e.g., from the apparatus 906) a request for the at least one parameter, such that the transmission component 904 transmits the indication of the at least one parameter based at least in part on the request.

The number and arrangement of components shown in FIG. 9 are provided as an example. In practice, there may be additional components, fewer components, different components, or differently arranged components than those shown in FIG. 9. Furthermore, two or more components shown in FIG. 9 may be implemented within a single component, or a single component shown in FIG. 9 may be implemented as multiple, distributed components. Additionally, or alternatively, a set of (one or more) components shown in FIG. 9 may perform one or more functions described as being performed by another set of components shown in FIG. 9.

The following provides an overview of some Aspects of the present disclosure:

Aspect 1: A method of wireless communication performed by a user equipment (UE), comprising: receiving, from a base station, an indication of a change in a non-linearity model associated with a power amplifier of the base station; updating a model associated with the power amplifier based at least in part on the indication; and updating at least one parameter associated with slicing received signals based at least in part on the indication.

Aspect 2: The method of Aspect 1, wherein the model and the at least one parameter are updated based at least in part on one or more pilots received from the base station.

Aspect 3: The method of Aspect 1, further comprising: receiving, from the base station, an indication of a new model, wherein the model is updated based at least in part on the new model.

Aspect 4: The method of Aspect 3, wherein the indication includes one or more of a look-up table, one or more vectors of look-up tables, or an indication of a kernel series and coefficients.

Aspect 5: The method of any of Aspects 3 through 4, further comprising: transmitting, to the base station, a request for the new model, wherein the indication of the new model is received based at least in part on the request.

Aspect 6: The method of any of Aspects 1 through 2, further comprising: receiving, from the base station, an indication of kernels, wherein the model is updated based at least in part on the kernels; and receiving, from the base station, one or more pilots, wherein coefficients associated with the model are updated based at least in part on the one or more pilots.

Aspect 7: The method of Aspect 6, further comprising: transmitting, to the base station, a request for the kernels, wherein the indication of the kernels is received based at least in part on the request.

Aspect 8: The method of any of Aspects 1 through 7, wherein the at least one parameter is updated based at least in part on the updated model.

Aspect 9: The method of any of Aspects 1 through 7, further comprising: receiving, from the base station, an indication of at least one new parameter, wherein the at least one parameter is updated based at least in part on the at least one new parameter.

Aspect 10: The method of Aspect 9, wherein the indication includes one or more of a look-up table or an indication of a kernel series.

Aspect 11: The method of any of Aspects 9 through 10, further comprising: transmitting, to the base station, a request for the at least one new parameter, wherein the indication of the at least one new parameter is received based at least in part on the request.

Aspect 12: The method of any of Aspects 1 through 11, wherein the at least one parameter is associated with a Bussgang decomposition.

Aspect 13: The method of any of Aspects 1 through 12, wherein the received signals include single-carrier waveforms.

Aspect 14: A method of wireless communication performed by a base station, comprising: determining a change in a non-linearity model associated with a power amplifier of the base station; and transmitting, to a user equipment (UE), an indication of the change.

Aspect 15: The method of Aspect 14, further comprising: transmitting, to the UE, one or more pilots for updating a model associated with the power amplifier.

Aspect 16: The method of Aspect 14, further comprising: transmitting, to the UE, an indication of a model associated with the power amplifier.

Aspect 17: The method of Aspect 16, wherein the indication includes one or more of a look-up table, one or more vectors of look-up tables, or an indication of a kernel series and coefficients.

Aspect 18: The method of any of Aspects 16 through 17, further comprising: receiving, from the UE, a request for the model, wherein the indication of the model is transmitted based at least in part on the request.

Aspect 19: The method of any of Aspects 14 through 15, further comprising: transmitting, to the UE, an indication of kernels for updating a model associated with the power amplifier; and transmitting, to the UE, one or more pilots for updating coefficients associated with the model.

Aspect 20: The method of Aspect 19, further comprising: receiving, from the UE, a request for the kernels, wherein the indication of the kernels is transmitted based at least in part on the request.

Aspect 21: The method of any of Aspects 14 through 20, further comprising: transmitting, to the UE, an indication of at least one parameter to use for slicing signals from the base station.

Aspect 22: The method of Aspect 21, wherein the indication includes one or more of a look-up table or an indication of a kernel series.

Aspect 23: The method of any of Aspects 21 through 22, further comprising: receiving, from the UE, a request for the at least one parameter, wherein the indication of the at least one parameter is transmitted based at least in part on the request.

Aspect 24: The method of any of Aspects 14 through 23, wherein the at least one parameter is associated with a Bussgang decomposition.

Aspect 25: The method of any of Aspects 14 through 24, wherein the signals from the base station include single-carrier waveforms.

Aspect 26: A method of wireless communication performed by a user equipment (UE), comprising: receiving, from a base station, a signal that was amplified using a power amplifier that is at least partially non-linear; estimating a portion of the received signal that includes an original data signal using slicing with at least two coefficients; estimating a portion of the signal that includes a distortion using a model associated with the power amplifier; and generating a reconstructed signal based at least in part on the received signal, the estimated portion including the original data signal, and the estimated portion including the distortion.

Aspect 27: The method of Aspect 26, wherein the portion including the original data signal and the portion including the distortion are estimated iteratively.

Aspect 28: The method of any of Aspects 26 through 27, wherein the signal includes single-carrier waveforms.

Aspect 29: The method of any of Aspects 26 through 28, wherein the slicing uses a plurality of odd powers with the at least two coefficients.

Aspect 30: The method of any of Aspects 26 through 29, wherein the slicing and estimation of the portion including the distortion are based at least in part on a Bussgang decomposition.

Aspect 31: An apparatus for wireless communication at a device, comprising a processor; memory coupled with the processor; and instructions stored in the memory and executable by the processor to cause the apparatus to perform the method of one or more of Aspects 1-13.

Aspect 32: A device for wireless communication, comprising a memory and one or more processors coupled to the memory, the one or more processors configured to perform the method of one or more of Aspects 1-13.

Aspect 33: An apparatus for wireless communication, comprising at least one means for performing the method of one or more of Aspects 1-13.

Aspect 34: A non-transitory computer-readable medium storing code for wireless communication, the code comprising instructions executable by a processor to perform the method of one or more of Aspects 1-13.

Aspect 35: A non-transitory computer-readable medium storing a set of instructions for wireless communication, the set of instructions comprising one or more instructions that, when executed by one or more processors of a device, cause the device to perform the method of one or more of Aspects 1-13.

Aspect 36: An apparatus for wireless communication at a device, comprising a processor; memory coupled with the processor; and instructions stored in the memory and executable by the processor to cause the apparatus to perform the method of one or more of Aspects 14-25.

Aspect 37: A device for wireless communication, comprising a memory and one or more processors coupled to the memory, the one or more processors configured to perform the method of one or more of Aspects 14-25.

Aspect 38: An apparatus for wireless communication, comprising at least one means for performing the method of one or more of Aspects 14-25.

Aspect 39: A non-transitory computer-readable medium storing code for wireless communication, the code comprising instructions executable by a processor to perform the method of one or more of Aspects 14-25.

Aspect 40: A non-transitory computer-readable medium storing a set of instructions for wireless communication, the set of instructions comprising one or more instructions that, when executed by one or more processors of a device, cause the device to perform the method of one or more of Aspects 14-25.

Aspect 41: An apparatus for wireless communication at a device, comprising a processor; memory coupled with the processor; and instructions stored in the memory and executable by the processor to cause the apparatus to perform the method of one or more of Aspects 26-30.

Aspect 42: A device for wireless communication, comprising a memory and one or more processors coupled to the memory, the one or more processors configured to perform the method of one or more of Aspects 26-30.

Aspect 43: An apparatus for wireless communication, comprising at least one means for performing the method of one or more of Aspects 26-30.

Aspect 44: A non-transitory computer-readable medium storing code for wireless communication, the code comprising instructions executable by a processor to perform the method of one or more of Aspects 26-30.

Aspect 45: A non-transitory computer-readable medium storing a set of instructions for wireless communication, the set of instructions comprising one or more instructions that, when executed by one or more processors of a device, cause the device to perform the method of one or more of Aspects 26-30.

The foregoing disclosure provides illustration and description, but is not intended to be exhaustive or to limit the aspects to the precise forms disclosed. Modifications and variations may be made in light of the above disclosure or may be acquired from practice of the aspects.

As used herein, the term "component" is intended to be broadly construed as hardware and/or a combination of hardware and software. "Software" shall be construed broadly to mean instructions, instruction sets, code, code segments, program code, programs, subprograms, software modules, applications, software applications, software packages, routines, subroutines, objects, executables, threads of execution, procedures, and/or functions, among other examples, whether referred to as software, firmware, middleware, microcode, hardware description language, or otherwise. As used herein, a processor is implemented in hardware and/or a combination of hardware and software. It will be apparent that systems and/or methods described herein may be implemented in different forms of hardware and/or a combination of hardware and software. The actual specialized control hardware or software code used to implement these systems and/or methods is not limiting of the aspects. Thus, the operation and behavior of the systems and/or methods were described herein without reference to specific software code—it being understood that software and hardware can be designed to implement the systems and/or methods based, at least in part, on the description herein.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various aspects. In fact, many of these features may be combined in ways not specifically recited in the claims and/or disclosed in the specification. Although each dependent claim listed below may directly depend on only one claim, the disclosure of various aspects includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Furthermore, as used herein, the terms "set" and "group" are intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A user equipment (UE) for wireless communication, comprising:
a memory; and
one or more processors coupled to the memory, the one or more processors configured to:
receive, from a network entity, an indication of a change in a non-linearity model associated with a power amplifier of the network entity;
update a model associated with the power amplifier based at least in part on the indication; and
update at least one parameter associated with slicing received signals based at least in part on the indication.

2. The UE of claim 1, wherein the model and the at least one parameter are updated based at least in part on one or more pilots received from the network entity.

3. The UE of claim 1, wherein the one or more processors are further configured to:
receive, from the network entity, an indication of a new model, wherein the model is updated based at least in part on the new model.

4. The UE of claim 3, wherein the indication of the new model includes one or more of a look-up table, one or more vectors of look-up tables, or an indication of a kernel series and coefficients.

5. The UE of claim 3, wherein the one or more processors are further configured to:
transmit, to the network entity, a request for the new model, wherein the indication of the new model is received based at least in part on the request.

6. The UE of claim 1, wherein the one or more processors are further configured to:
receive, from the network entity, an indication of kernels, wherein the model is updated based at least in part on the kernels; and
receive, from the network entity, one or more pilots, wherein coefficients associated with the model are updated based at least in part on the one or more pilots.

7. The UE of claim 6, wherein the one or more processors are further configured to:
transmit, to the network entity, a request for the kernels, wherein the indication of the kernels is received based at least in part on the request.

8. The UE of claim 1, wherein the at least one parameter is updated based at least in part on the updated model.

9. The UE of claim 1, wherein the one or more processors are further configured to:
receive, from the network entity, an indication of at least one new parameter, wherein the at least one parameter is updated based at least in part on the at least one new parameter.

10. The UE of claim 9, wherein the indication of the at least one new parameter includes one or more of a look-up table or an indication of a kernel series.

11. The UE of claim 9, wherein the one or more processors are further configured to:
transmit, to the network entity, a request for the at least one new parameter, wherein the indication of the at least one new parameter is received based at least in part on the request.

12. The UE of claim 1, wherein the at least one parameter is associated with a Bussgang decomposition.

13. The UE of claim 1, wherein the received signals include single-carrier waveforms.

14. A network entity for wireless communication, comprising:
a memory; and
one or more processors coupled to the memory, the one or more processors configured to:
determine a change in a non-linearity model associated with a power amplifier of the network entity;
transmit, to a user equipment (UE), an indication of the change; and
transmit, to the UE, one or more pilots for updating a model associated with the power amplifier.

15. A network entity for wireless communication, comprising:
a memory; and
one or more processors coupled to the memory, the one or more processors configured to:
determine a change in a non-linearity model associated with a power amplifier of the network entity;

transmit, to a user equipment (UE), an indication of the change;

transmit, to the UE, an indication of a model associated with the power amplifier; and receive, from the UE, a request for the model, wherein the indication of the model is transmitted based at least in part on the request.

16. The network entity of claim 15, wherein the indication of the model includes one or more of a look-up table, one or more vectors of look-up tables, or an indication of a kernel series and coefficients.

17. A network entity for wireless communication, comprising:

a memory; and one or more processors coupled to the memory, the one or more processors configured to:

determine a change in a non-linearity model associated with a power amplifier of the network entity;

transmit, to a user equipment (UE), an indication of the change;

transmit, to the UE, an indication of kernels for updating a model associated with the power amplifier; and transmit, to the UE, one or more pilots for updating coefficients associated with the model.

18. The network entity of claim 17, wherein the one or more processors are further configured to:

receive, from the UE, a request for the kernels, wherein the indication of the kernels is transmitted based at least in part on the request.

19. A network entity for wireless communication, comprising:

a memory; and one or more processors coupled to the memory, the one or more processors configured to:

determine a change in a non-linearity model associated with a power amplifier of the network entity;

transmit, to a user equipment (UE), an indication of the change; and transmit, to the UE, an indication of at least one parameter to use for slicing signals from the network entity.

20. The network entity of claim 19, wherein the indication of the at least one parameter includes one or more of a look-up table or an indication of a kernel series.

21. The network entity of claim 19, wherein the one or more processors are further configured to:

receive, from the UE, a request for the at least one parameter, wherein the indication of the at least one parameter is transmitted based at least in part on the request.

22. The network entity of claim 19, wherein the at least one parameter is associated with a Bussgang decomposition.

23. The network entity of claim 19, wherein the signals from the network entity include single-carrier waveforms.

24. A method of wireless communication performed by a user equipment (UE), comprising:

receiving, from a network entity, an indication of a change in a non-linearity model associated with a power amplifier of the network entity;

updating a model associated with the power amplifier based at least in part on the indication; and updating at least one parameter associated with slicing received signals based at least in part on the indication.

25. The method of claim 24, wherein the model and the at least one parameter are updated based at least in part on one or more pilots received from the network entity.

26. The method of claim 24, further comprising:

receiving, from the network entity, an indication of a new model, wherein the model is updated based at least in part on the new model.

27. The method of claim 26, wherein the indication of the new model includes one or more of a look-up table, one or more vectors of look-up tables, or an indication of a kernel series and coefficients.

28. The method of claim 26, further comprising:

transmitting, to the network entity, a request for the new model, wherein the indication of the new model is received based at least in part on the request.

* * * * *